(12) United States Patent
Park et al.

(10) Patent No.: US 9,118,003 B2
(45) Date of Patent: Aug. 25, 2015

(54) VARIABLE RESISTANCE MEMORY DEVICES AND METHOD OF FORMING THE SAME

(71) Applicant: Samsung Electronics Co., Ltd., Suwon-si, Gyeonggi-do (KR)

(72) Inventors: JeongHee Park, Hwaseong-si (KR); Mansug Kang, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/792,952

(22) Filed: Mar. 11, 2013

(65) Prior Publication Data

US 2013/0270507 A1   Oct. 17, 2013

(30) Foreign Application Priority Data

Apr. 13, 2012   (KR) .................. 10-2012-0038266

(51) Int. Cl.
*H01L 47/00* (2006.01)
*H01L 45/00* (2006.01)
*H01L 27/24* (2006.01)

(52) U.S. Cl.
CPC ........ *H01L 45/1253* (2013.01); *H01L 27/2409* (2013.01); *H01L 27/2463* (2013.01); *H01L 45/06* (2013.01); *H01L 45/126* (2013.01); *H01L 45/1233* (2013.01); *H01L 45/143* (2013.01); *H01L 45/144* (2013.01); *H01L 45/16* (2013.01); *H01L 45/1683* (2013.01)

(58) Field of Classification Search
None
See application file for complete search history.

(56) References Cited

U.S. PATENT DOCUMENTS

| 7,671,360 | B2 | 3/2010 | Sato et al. | |
|---|---|---|---|---|
| 7,696,507 | B2 | 4/2010 | Khang et al. | |
| 8,552,412 | B2 * | 10/2013 | Park et al. | 257/4 |
| 2010/0104556 | A1 | 4/2010 | Blankenstein et al. | |
| 2010/0230654 | A1 * | 9/2010 | Liu et al. | 257/4 |
| 2011/0147695 | A1 | 6/2011 | Lee et al. | |
| 2012/0119181 | A1 * | 5/2012 | Oh et al. | 257/4 |

FOREIGN PATENT DOCUMENTS

| KR | 10-0207474 B1 | 4/1999 |
|---|---|---|
| KR | 10-0728983 B1 | 6/2007 |
| KR | 10-2008-0028544 A | 4/2008 |
| KR | 10-2009-0015717 A | 2/2009 |
| KR | 10-2010-0059328 A | 6/2010 |
| KR | 10-2011-0000961 A | 1/2011 |

* cited by examiner

*Primary Examiner* — Marvin Payen
(74) *Attorney, Agent, or Firm* — Lee & Morse, P.C.

(57) ABSTRACT

A variable resistance memory device includes a lower electrode on a substrate, a variable resistance pattern on the lower electrode, and an upper electrode on the variable resistance pattern. The upper electrode is in contact with at least a sidewall of the variable resistance pattern.

15 Claims, 34 Drawing Sheets

VARIABLE RESISTANCE MEMORY DEVICES AND METHOD OF FORMING THE SAME

CROSS-REFERENCE TO RELATED APPLICATION

The present application claims priority under 35 U.S.C. §119 to Korean Patent Application No. 10-2012-0038266, filed on Apr. 13, 2012, in the Korean Intellectual Property Office, and entitled: "Variable Resistance Memory Devices and Method of Forming the Same," which is incorporated by reference herein in its entirety.

BACKGROUND

Next generation semiconductor memory devices (such as a ferroelectric random access memory (FRAM), a magnetic random access memory (MRAM), and a phase-change random access memory (PRAM)) have been developed in view of achieving high performance and low power consumption. Materials constituting the next generation semiconductor memory devices may have resistance values that change depending on a current and a voltage, and may have non-volatile properties that are maintained even if the current or the voltage is interrupted.

SUMMARY

Embodiments may be realized by providing a variable resistance memory device including a lower electrode on a substrate, a variable resistance pattern on the lower electrode, and an upper electrode on the variable resistance pattern. The upper electrode is in contact with at least a sidewall of the variable resistance pattern.

A top surface of the variable resistance pattern may be higher than a bottom surface of the upper electrode. The variable resistance memory device may further include a mold layer adjacent to the variable resistance pattern, and an upper portion of the variable resistance pattern may protrude above a top surface of the mold layer. The upper electrode may be in contact with an entirety of sidewalls of the variable resistance pattern that protrude above the top surface of the mold layer. The variable resistance pattern may be one of a plurality of variable resistance patterns arranged in the mold layer, and upper portions of the variable resistance patterns that protrude above the mold layer may be connected to each other in a first direction.

The variable resistance memory device may further include a first spacer between the mold layer and the lower electrode. The lower electrode may be in the mold layer, may be under the variable resistance pattern, and may have an L-shaped cross section. The variable resistance memory device may further include a filling insulating layer between the variable resistance pattern and one of the plurality of variable resistance patterns adjacent to the variable resistance pattern, and a second spacer between the filling insulating layer and the variable resistance pattern, and between the lower electrode and the filling insulating layer.

The filling insulating layer and the second spacer may be formed of the same material as the mold layer. Top surfaces of the filling insulating layer, the second spacer, and the mold layer may be substantially coplanar with each other. The upper electrode may extend to cover a top surface of the variable resistance pattern.

Embodiments may also be realized by providing a method of forming a variable resistance memory device that includes forming a mold layer on a substrate, forming a lower electrode in the mold layer, forming a variable resistance pattern on the lower electrode in the mold layer, removing an upper portion of the mold layer to expose a top surface and a sidewall of the variable resistance pattern, and forming an upper electrode in contact with at least the sidewall of the variable resistance pattern.

Removing the upper portion of the mold layer may include converting the upper portion of the mold layer into a sacrificial layer, and removing the sacrificial layer. The mold layer may be a silicon nitride layer and the sacrificial layer may be a silicon oxide layer. Converting the upper portion of the mold layer into the sacrificial layer may include treating a top surface of the mold layer by a hydrogen plasma to break a combination of silicon and nitrogen in the silicon nitride layer, and combining the silicon broken from the nitrogen with oxygen in an air to form the silicon oxide layer of the sacrificial layer.

Treating the top surface of the mold layer by the hydrogen plasma may include supplying a hydrogen gas and an inert gas to convert the hydrogen gas into a plasma state, and the hydrogen gas may be supplied with a content ratio within a range of 0.1 vol % to 99 vol % with respect to a total amount of the hydrogen gas and the inert gas.

The mold layer may include a first mold layer and a second mold layer. Forming the variable resistance pattern and exposing the sidewall of the variable resistance pattern may include removing an upper portion of the lower electrode to form a recessed region exposing at least a sidewall of the second mold layer, forming the variable resistance pattern to fill the recessed region and to contact the lower electrode, and removing the second mold layer to expose the sidewall of the variable resistance pattern.

Embodiments may also be realized by providing a variable resistance memory device that includes an upper electrode extending in a first direction, the upper electrode including a plurality of indentations, and a plurality of variable resistance patterns arranged along the first direction. Each of the plurality of variable resistance patterns includes an upper portion within one of the plurality of indentations in the upper electrode.

The variable resistance memory device may further include a plurality of lower electrodes arranged along the first direction, each of the lower electrodes may be in contact with one of the plurality of variable resistance patterns, and a plurality of lower electrode pads may be arranged along the first direction. Each of the plurality of lower electrodes may be seated on a stepped portion of one of the plurality of lower electrode pads, and each of the plurality of variable resistance patterns may overlap the stepped portion of one of the plurality of lower electrode pads.

The upper electrode may be in contact with lateral sides of each of the plurality of variable resistance patterns, and the plurality of variable resistance patterns may be spaced apart from each other by a plurality of insulating layers. The lateral sides of the each of the plurality of variable resistance patterns may protrude above uppermost surfaces of the insulating layers. The plurality of indentations in the upper electrode may have a same shape as the upper portion of each of the plurality of variable resistance patterns, and an uppermost surface of each of the plurality of variable resistance patterns may be substantially flat.

Each of the plurality of variable resistance patterns may include a lower portion that is surrounded by a plurality of insulating layers, the insulating layers may define recesses for housing the plurality of variable resistance patterns therein, and the upper portion of each of the plurality of variable resistance patterns may be excluded from the recesses thereunder. The upper electrode may be directly on at least one of the plurality of insulating layers, and the upper electrode may be above each of the plurality of insulating layers.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
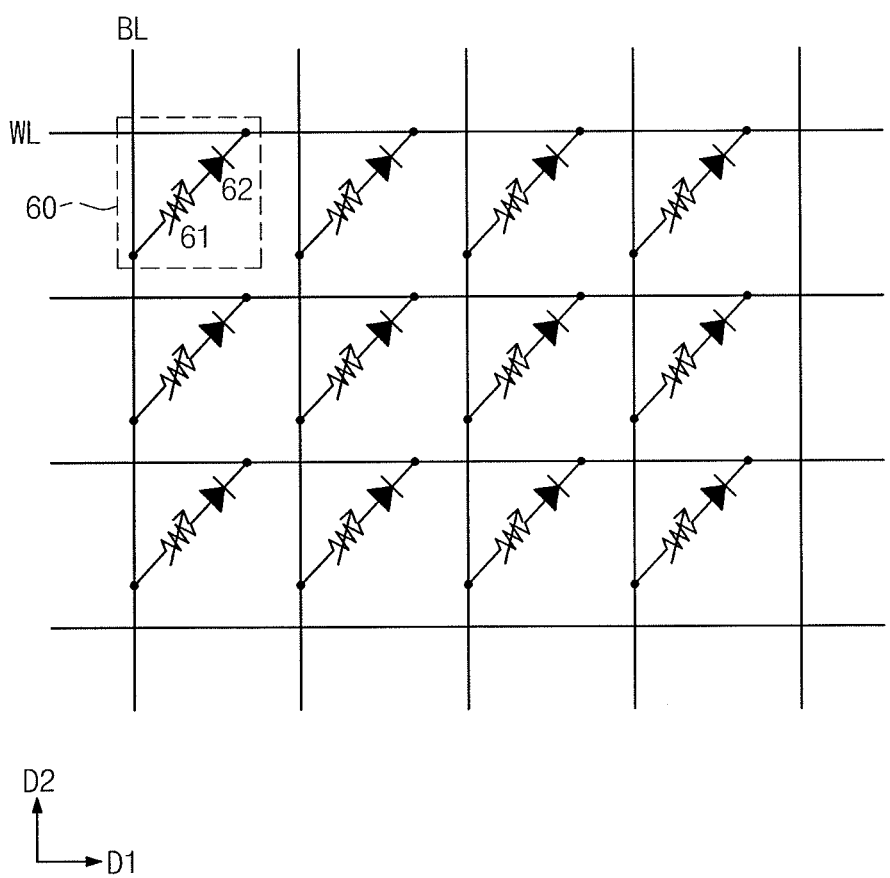
FIG. 1 illustrates a circuit diagram of a memory cell array of a variable resistance memory device according to exemplary embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Further, embodiments are not limited to the specific examples provided herein. Like reference numerals refer to like elements throughout.

The terminology used herein is for the purpose of describing particular embodiments only and is not intended to limit the embodiments. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views. Accordingly, shapes of the exemplary views may be modified according to manufacturing techniques and/or allowable errors. Therefore, the embodiments are not limited to the specific shapes illustrated in the exemplary views, but may include other shapes that may be created according to manufacturing processes. Areas exemplified in the drawings have general properties, and are used to illustrate specific shapes of elements. Thus, this should not be construed as limiting.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings. Exemplary embodiments explained and illustrated herein include their complementary counterparts. The same reference numerals or the same reference designators denote the same elements throughout the specification.

Moreover, exemplary embodiments are described herein with reference to cross-sectional illustrations and/or plane illustrations that are exemplary illustrations. Accordingly, variations from the shapes of the illustrations as a result, e.g., of manufacturing techniques and/or tolerances, may be expected. Thus, exemplary embodiments should not be construed as limited to the shapes of regions illustrated herein but are to include deviations in shapes that result, e.g., from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a circuit diagram illustrating a memory cell array of a variable resistance memory device according to exemplary embodiments.

Referring to FIG. 1, a plurality of memory cells 60 may be arranged in matrix form in a variable resistance memory device 100. Each of the memory cells 60 may include at least a variable resistance element 61 and a selection element 62. The variable resistance element 61 may be connected between a bit line BL and the selection element 62. The selection element 62 may be connected between the variable resistance 61 and a word line WL.

The variable resistance element 61 may include, e.g., a phase-change material, a ferroelectric material, or a magnetic material. A state of the variable resistance element 61 may be determined depending on the amount of a current applied through the bit line BL and/or the word line WL.

The selection element 62 may be connected between the variable resistance element 61 and the word line WL. The selection element 62 may control the current applied to the variable resistance element 61 according to a voltage of the word line WL. The selection element 62 is illustrated as a diode in FIG. 1. However, the embodiments are not limited thereto, e.g., the selection element 62 may be used as an AMOS transistor or a bipolar transistor.

Hereinafter, a variable resistance memory device including memory cells using a phase-change material as the variable resistance element 61 will be described as an exemplary embodiment. However, embodiments are not limited thereto, e.g., embodiments may be applied to a resistance random access memory (RRAM), a ferroelectric RAM (FRAM), and/or a magnetic RAM (MRAM).

In embodiments, a resistance of the phase-change material used as the variable resistance element 61 may be changed according to a temperature. In other words, the phase-change material may exhibit one of an amorphous state having a relatively high resistance and a crystalline state having a relatively low resistance according to the temperature and/or a cooling time. Joule's heat may be generated by the current applied through a lower electrode to heat the phase-change material of the variable resistance element 61. The Joule's heat may be generated in proportion to a resistivity of the phase-change material and a supplying time of the current.

Figure 2A:
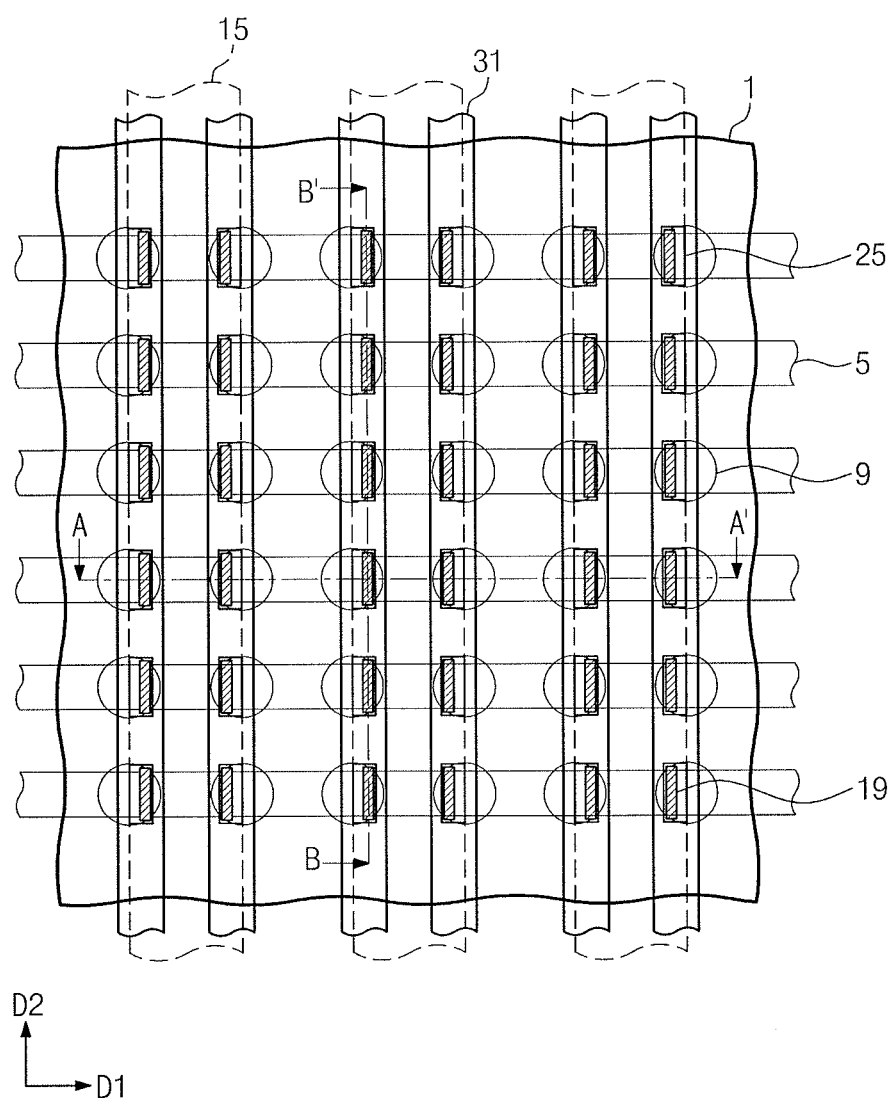
FIG. 2A illustrates a plan view of a variable resistance memory device according to exemplary embodiments.
Figure 2B:
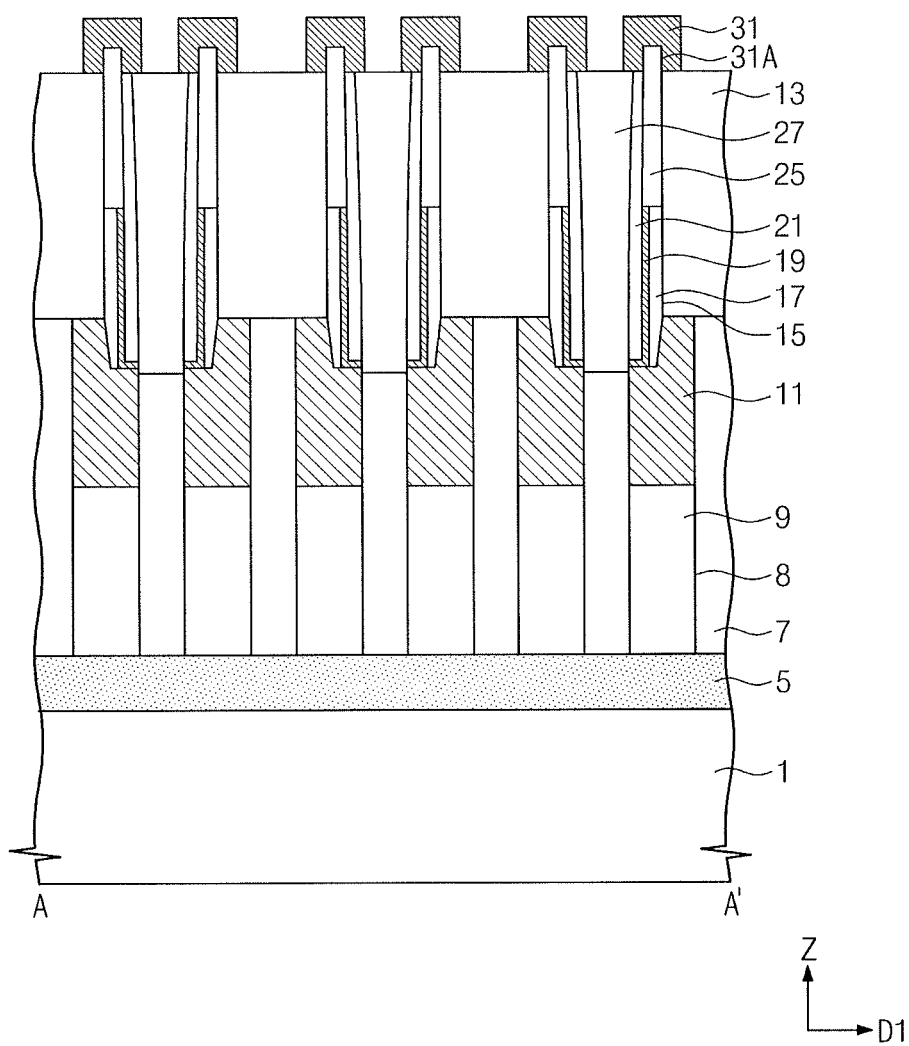
FIGS. 2B and 2C illustrate cross-sectional views taken along lines A-A' and B-B' of FIG. 2A, respectively.
Figure 2C:
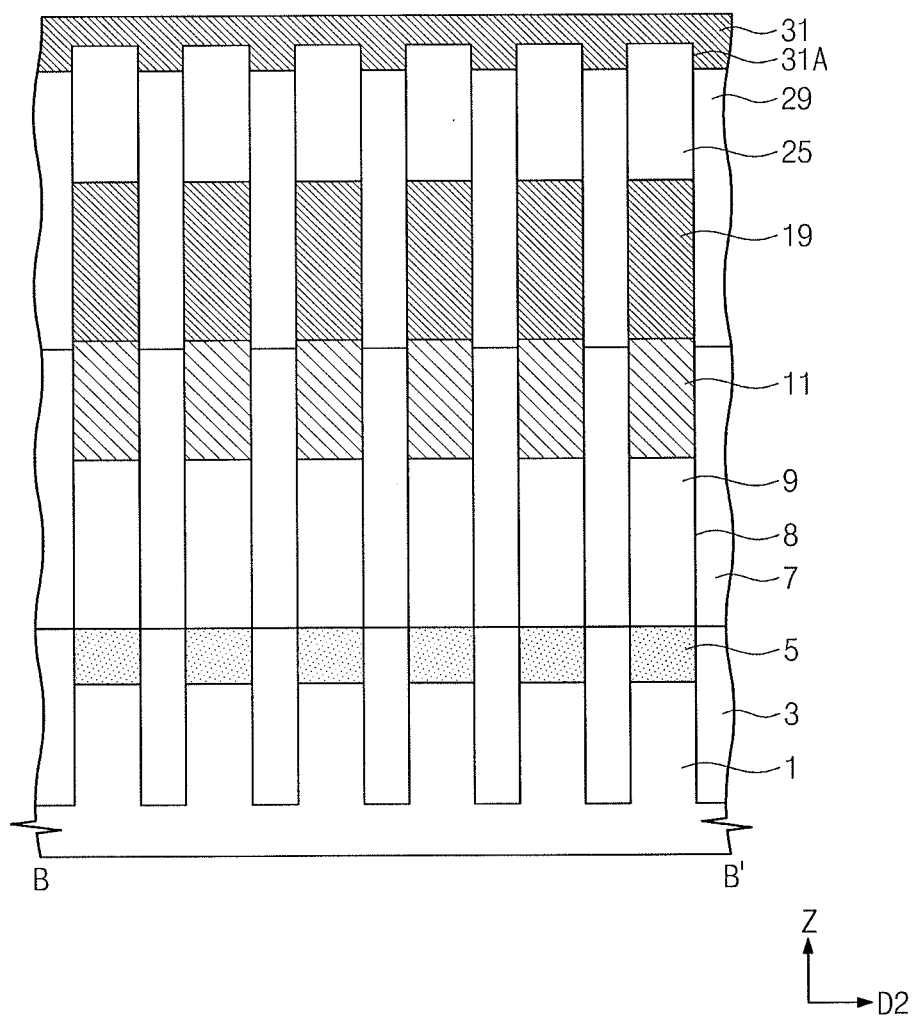

FIG. 2A is a plan view illustrating a variable resistance memory device according to some exemplary embodiments. FIGS. 2B and 2C are cross-sectional views taken along lines A-A' and B-B' of FIG. 2A, respectively.

FIGS. 2A, 2B, and 2C, a variable resistance memory device according to the present embodiment includes a plurality of word lines (WL) 5 disposed on a substrate 1. The plurality of word lines 5 may extend in a first direction D1 substantially in parallel with each other. A plurality of device isolation patterns 3 may extend in the first direction D1 and may be disposed on the substrate 1 to define active regions. The word lines 5 may be dopant doped regions disposed in the substrate 1 of the active regions. According to another exemplary embodiment, the word lines 5 may be conductive patterns on the active regions.

Upper electrodes 31 may be arranged substantially in parallel with each other and the upper electrodes 31 may be disposed over, e.g., above, the word lines 5. The upper electrodes 31 may extend in a second direction D2 so as to cross over the word lines 5, e.g., the first direction D1 may intersect and/or be perpendicular to the second direction D2. An interlayer insulating layer 7 may be disposed on the substrate 1 and may be arranged between the upper electrodes 31 and the word lines 5. A selection element-hole 8 may be formed in the interlayer insulating layer 7 of each of crossing regions of the upper electrodes 31 and the word lines 5. For example, a plurality of selection element-holes 8 may be formed in regions where the upper electrodes 31 overlap the word lines 5, e.g., so that one selection element-hole 8 is formed in each region where one of the upper electrodes 31 overlaps one of the word lines 5.

A selection element 9 may be disposed in the selection element-hole 8, e.g., to partially fill the selection element-hole 8. For example, the selection element 9 may include a diode. The selection element 9 may include a first semiconductor pattern and a second semiconductor pattern that are doped with dopants of conductivity types different from each other, respectively.

A lower electrode pad 11 may be disposed on the selection element 9 and in the selection element-hole 8. The selection element 9 and the lower electrode pad 11 may fill, e.g., completely fill, the selection element-hole 8. For example, the lower electrode pad 11 may include at least one of a metal silicide, a metal nitride, and a metal. Even through not shown in the drawings, an ohmic layer such as a metal silicide may be disposed between the lower electrode pad 11 and the selection element 9.

A mold layer 13 may be disposed on the interlayer insulating layer 7. The mold layer 13 may be an insulating layer, e.g., the mold layer 13 may be formed of a silicon nitride layer. Grooves 15 extending in the second direction D2 may be formed in the mold layer 13. The grooves 15 may expose partial portions of lower electrode pads 11 adjacent to each other in the first direction D1 and portions of the interlayer insulating layer 7 therebetween.

Lower electrodes 19 may be disposed in each of the grooves 15. The lower electrode 19 may be in contact with the lower electrode pad 11. The lower electrode 19 may include one selected from the group of Ti, $TiSi_x$, TiN, TiON, TiW, TiAlN, TiAlON, TiSiN, TiBN, W, $WSi_x$, WN, WON, WSiN, WBN, WCN, Ta, $TaSi_x$, TaN, TaON, TaAlN, TaSiN, TaCN, Mo, MoN, MoSiN, MoAlN, NbN, ZrSiN, ZrAlN, Ru, CoSi, NiSi, a conductive carbon (C) group, Cu, and any combination thereof. In some embodiments, the lower electrode 19 may have an L-shaped cross section, e.g., along the first direction D1.

A first spacer 17 may be disposed between the mold layer 13 and the lower electrode 19. For example, the first spacer 17 may be formed of a silicon oxide layer. A variable resistance pattern 25 may be disposed on the lower electrode 19 and the first spacer 17 in the groove 15, e.g., the variable resistance pattern 25 may cover uppermost surfaces of both the lower electrode 19 and the first spacer 17.

The variable resistance pattern 25 may be a phase-change material. For example, the variable resistance pattern 25 may include a chalcogenide element. In detail, the variable resistance pattern 25 may include at least one selected from the group of Ge—Sb—Te, As—Sb—Te, As—Ge—Sb—Te, Sn—Sb—Te, a group 5A element-Sb—Te, a group 6A element-Sb—Te, a group 5A element-Te, a group 6A element-Te, a group 5A element-Se, and a group 6A element-Se. The variable resistance pattern 25 may be doped with at least one selected from the group of group 3A elements (e.g., B, Al, Ga, In, Tl), group 4A elements (e.g., C, Si, Sn, Pb), and group 5A elements (e.g., N, P, As, Ge, Sb, Bi). A contact area of the lower electrode 19 and the variable resistance pattern 25 may be reduced due to the first spacer 17. Thus, a program current may be reduced.

A first filling insulating layer 27 may be disposed between the variable resistance patterns 25 adjacent to each other in the first direction D1. A second spacer 21 may be disposed between the first filling insulating layer 27 and the variable resistance pattern 25 and between the first filling insulating layer 27 and the lower electrode 19. The second spacer 21 and the first filling insulating layer 27 may be formed of the same material as the mold layer 13. For example, the second spacer 21 and the first filling insulating layer 27 may be formed of a silicon nitride layer. A bottom surface of the second spacer 21 may be higher, e.g., further away from the substrate 1, than a bottom surface of the lower electrode 19. The second spacer 21 may be spaced apart from the lower electrode pad 11. A bottom surface of the first filling insulating layer 27 may be disposed at a level substantially equal to or lower than the bottom surface of the lower electrode 19.

Referring to FIG. 2C, a second filling insulating layer 29 may be disposed between the lower electrodes 19 adjacent to each other in the second direction D2. The second filling insulating layer 29 may extend upwardly, e.g., such that the interlayer insulating layer 7 is thereunder, to be disposed between the variable resistance patterns 25 adjacent to each other in the second direction D2. The second filling insulating layer 29 may extend in the first direction D1 so as to cross the groove 15. For example, the second filling insulating layer 29 may divide the mold layer 13 into parts, e.g., discrete portions. The second insulating layer 29 may be formed of the same material as the first filling insulating layer 27. Top surfaces of the second filling insulating layer 29, the first filling insulating layer 27, the second spacer 21, and the mold layer 13 may be substantially coplanar with each other. A bottom surface of the second filling insulating layer 29 may be disposed at a level substantially equal to or lower than the bottom surface of the lower electrode 19.

Referring to FIG. 2B, an upper portion of the variable resistance pattern 25 may protrude from the top surface of the mold layer 13. For example, the top surface of the variable resistance pattern 25 is higher than the top surfaces of the mold layer 13, the second spacer 21, the first filling insulating layer 27, and the second filling insulating layer 29. Thus, an upper sidewall of the variable resistance pattern 25 may be exposed. The exposed upper sidewall of the variable resistance pattern 25 may be in contact with the upper electrode 31. For example, the upper sidewall of the variable resistance pattern 25 may be arranged within an indentation 31A in the upper electrode 31.

According to an exemplary embodiment, the variable resistance patterns 25 may be isolated from each other by the second filling insulating layer 29, the first filling insulating layer 27, the second spacer 21, and the mold layer 13 arranged therebetween. The variable resistance patterns 25 may be disposed as islands isolated from each other. All the upper sidewalls of the variable resistance patterns 25 may be exposed. The upper electrode 31 may extend in the second direction D2 and may be in contact with the exposed upper sidewalls of ones the variable resistance patterns 25 arranged in a linear pattern in the second direction D2.

In the above variable resistance memory device, since the upper electrode 31 is in contact with the top surface and the sidewalls of the variable resistance patterns 25, a contact area of the upper electrode 31 and the variable resistance patterns 25 is increased. Thus, when the variable resistance patterns 25 shrink by a subsequent thermal process, it is possible to decrease an interfacial separation risk between the upper electrode 31 and the variable resistance patterns 25 that may be caused by the shrinkage of the variable resistance patterns 25. Further, a parasitic resistance between the upper electrode 31 and the variable resistance pattern 25 may be reduced and a reset current may be reduced. As a result, reliability of the variable resistance memory device may be improved.

In FIG. 2A, the upper electrode 31 covers the top surface and the upper sidewalls of the variable resistance pattern 25. Alternatively, the upper electrode 31 may cover only the sidewalls of the variable resistance pattern 25 and the top surface of the upper electrode 31 may be exposed.

A method of forming the variable resistance memory device will be described hereinafter.

FIGS. 3A, 4A, 5A, 6A, and 7A are plan views depicting stages in a method of forming a variable resistance memory device of FIG. 2A. FIGS. 3B, 4B, 5B, 6B, 7B, 7D, and 8A are cross-sectional views depicting stages in a method of forming the variable resistance memory device of FIG. 2B. FIGS. 3C, 4C, 5C, 6C, 7C, 7E, and 8B are cross-sectional views depicting stages in a method of forming the variable resistance memory device of FIG. 2C.

Figure 3A:
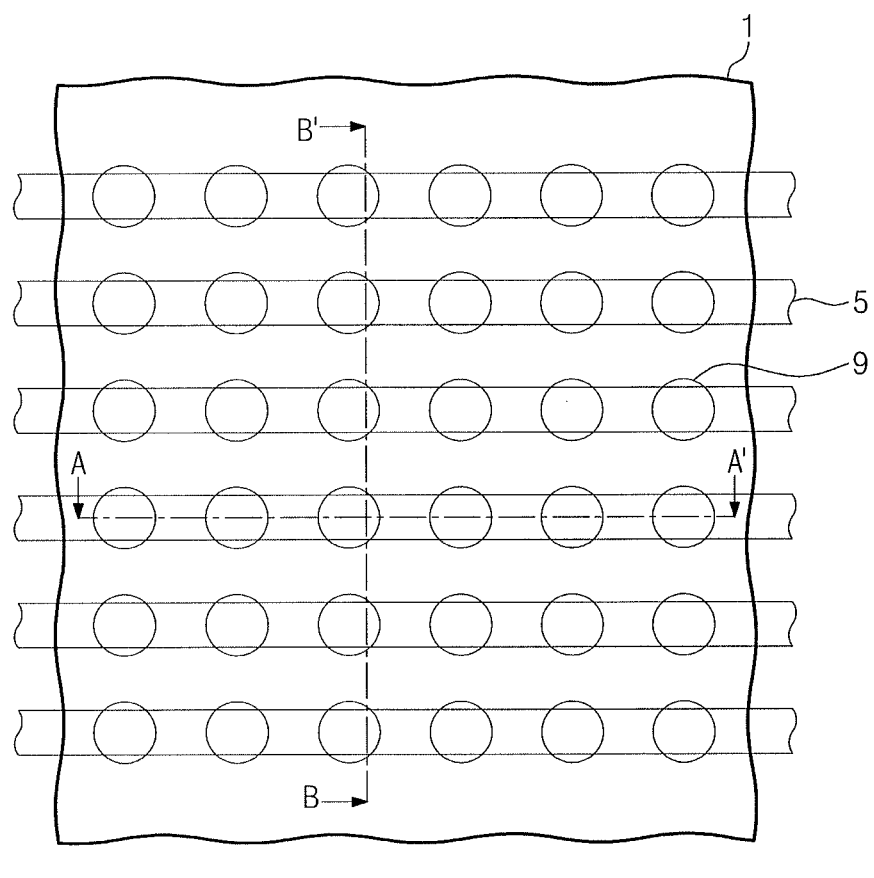
FIGS. 3A, 4A, 5A, 6A, and 7A illustrate plan views depicting stages in a method of forming the variable resistance memory device as shown in FIG. 2A, according to an exemplary embodiment.
Figure 3B:
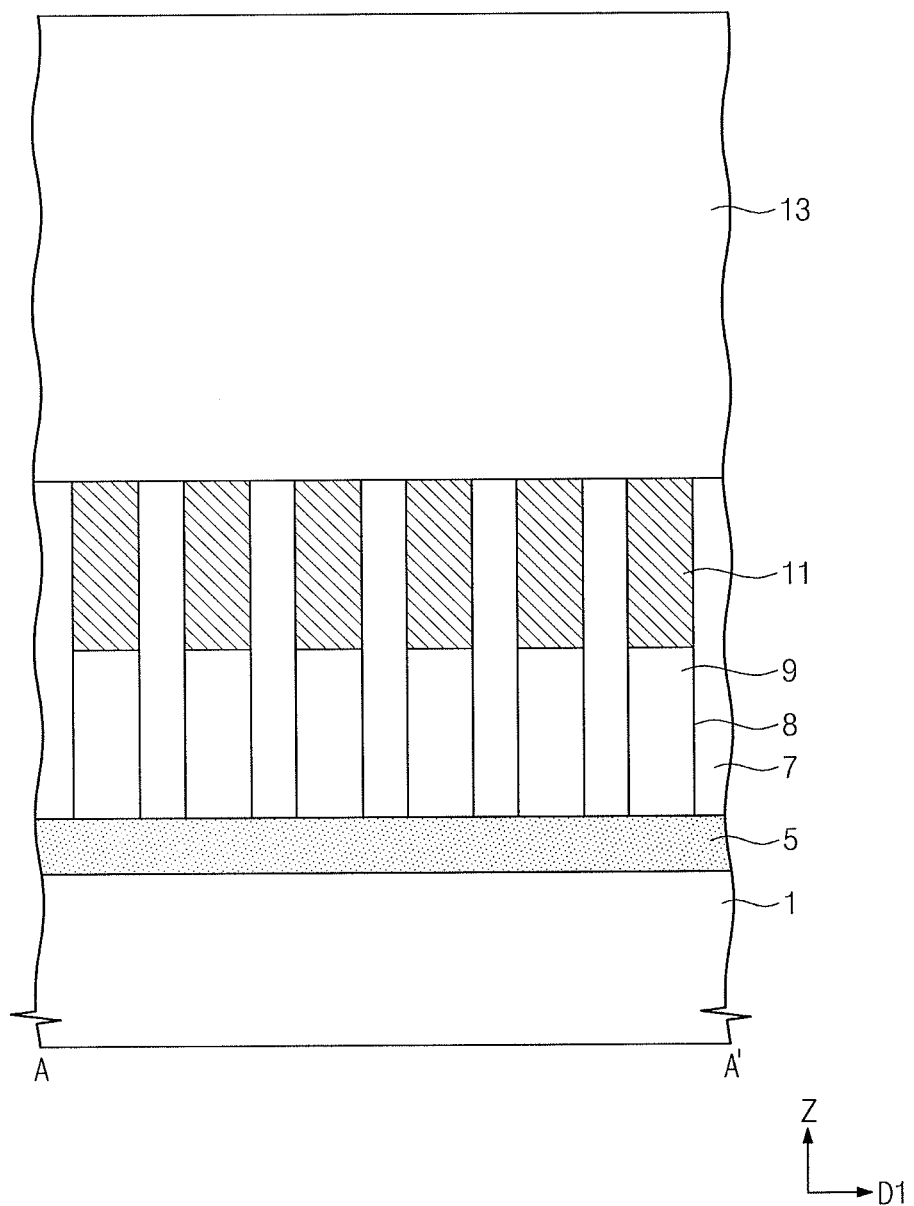
FIGS. 3B, 4B, 5B, 6B, 7B, 7D, and 8A illustrate cross-sectional views depicting stages in a method of forming the variable resistance memory device as shown in FIG. 2B, according to an exemplary embodiment.
Figure 3C:
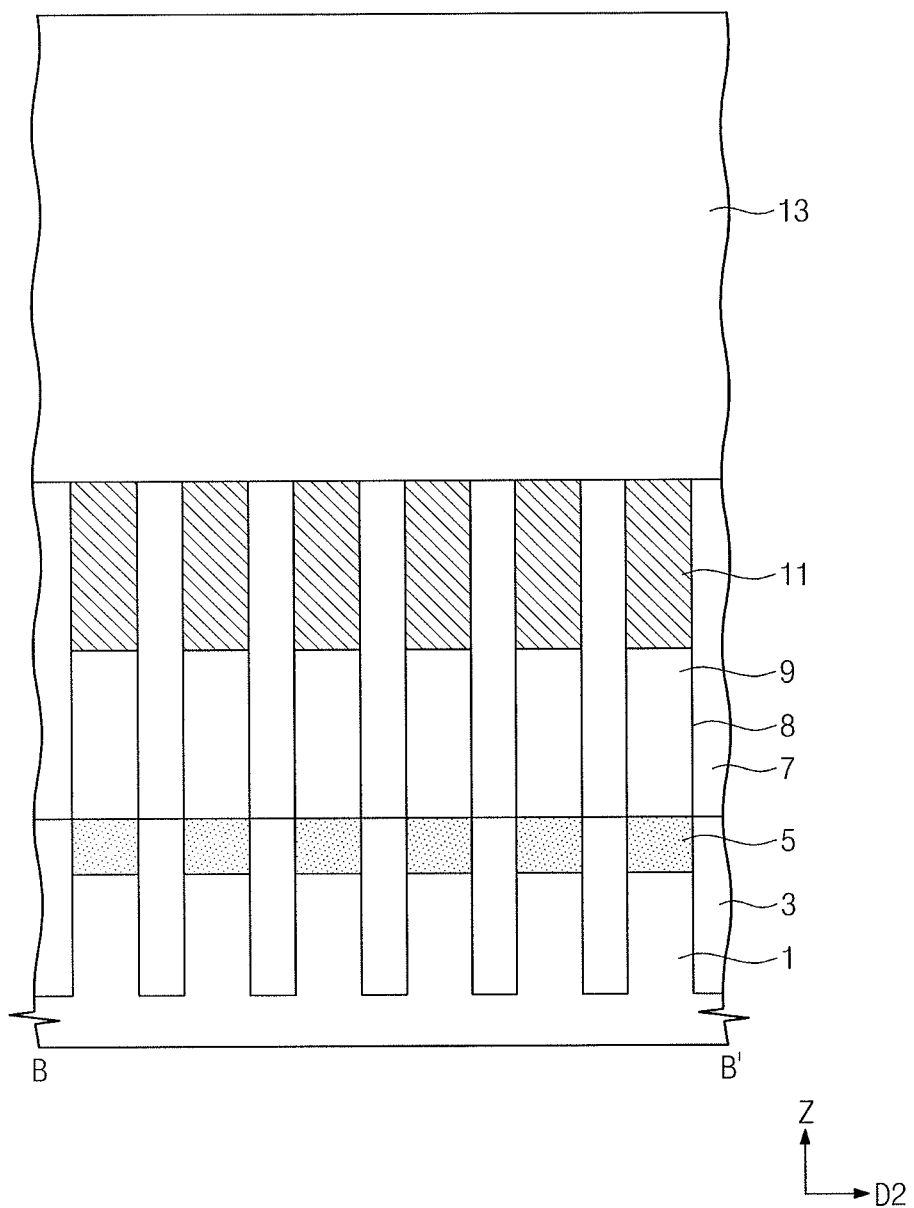
FIGS. 3C, 4C, 5C, 6C, 7C, 7E, and 8B illustrate cross-sectional views depicting stages in a method of forming the variable resistance memory device as shown in FIG. 2C.

Referring to FIGS. 3A, 3B, and 3C, a plurality of device isolation patterns 3 extending in a first direction D1 may be formed on the substrate 1 to define active regions. The substrate 1 may have a semiconductor-based structure including a silicon surface. For example, the semiconductor-based structure may include a silicon substrate, a silicon on an insulator (SOI), a silicon-germanium (SiGe) substrate, a germanium (Ge) substrate, a gallium-arsenic (GaAs) substrate, or a silicon epitaxial layer supported by a semiconductor substrate such as an undoped or doped silicon. The substrate 1 may be a P-type silicon substrate doped with P-type dopants. The device isolation patterns 3 may be formed to have linear shapes crossing the substrate 1. The device isolation patterns 3 may be formed by a shallow trench isolation (STI) process technique.

Dopants may be injected into the substrate 1 of the active regions to form a plurality of word lines 5 spaced apart from each other. The word lines 5 may be formed by implanting N-type dopant ions into the active regions of the substrate 1. According to another exemplary embodiment, the word lines 5 may be formed by one of various other methods. For example, a plurality of parallel epitaxial semiconductor patterns may be formed on the substrate 1 and then the dopant ions may be implanted into the epitaxial semiconductor patterns to form the word lines 5. In another embodiment, the epitaxial semiconductor patterns may be doped with the dopants in situ to form the word lines 5. In still other embodiments, the word lines 5 may be formed of a conductive thin layer disposed on the substrate 1.

An interlayer insulating layer 7 may be formed on the substrate 1 having the word lines 5 formed thereon. The interlayer insulating layer 7 may cover portions of the word lines 5 and portions of the device isolation patterns 3. According to an exemplary embodiment, the interlayer insulating layer 7 may be formed of a deposited silicon oxide layer. The interlayer insulating layer 7 may be patterned to form a plurality of selection element-holes 8 that expose the word lines 5.

A selection element 9 may be formed in each of the selection element-holes 8. For example, a diode used as the selection element 9 may be formed in the selection element-hole 8. The selection element 9 may be formed by stacking an N-type semiconductor layer and a P-type semiconductor layer. In some embodiments, a semiconductor layer of silicon, germanium, or silicon-germanium may be formed in the selection element-hole 8 and then dopants may be injected in to the semiconductor layer to form the selection element 9.

The semiconductor layer in the selection element-hole 8 may be a selective epitaxial growth (SEG) process or a solid phase epitaxial growth (SPE) process. In the SEG process, an epitaxial layer may be grown using the word line 5 exposed by the selection element-hole 8 as a seed layer. According to another exemplary embodiment, in the SPE process, an amorphous or poly-crystalline semiconductor layer may be formed in the selection element-hole 8 and then the amorphous or poly-crystalline semiconductor layer may be crystallized. The selection element 9 may be formed to partially fill the selection element-hole 8.

A lower electrode pad 11 may be formed on the selection element 9 in the selection element-hole 8. Even though not shown in the drawings, before the lower electrode pad 11 is formed, an ohmic layer of a metal silicide may be formed. For example, the lower electrode pad 11 may be formed of tungsten. A conductive layer may be formed to fill the selection element-hole 8 and then be planarized, so that the lower electrode 11 may be formed in the selection element-hole 8 and a top surface of the interlayer insulating layer 7 may be exposed. A top surface of the lower electrode pad 11 may be substantially coplanar with the top surface of the interlayer insulating layer 7. A mold layer 13 may be formed on the interlayer insulating layer 7. The mold layer 13 may be formed of a silicon nitride layer.

Figure 4A:
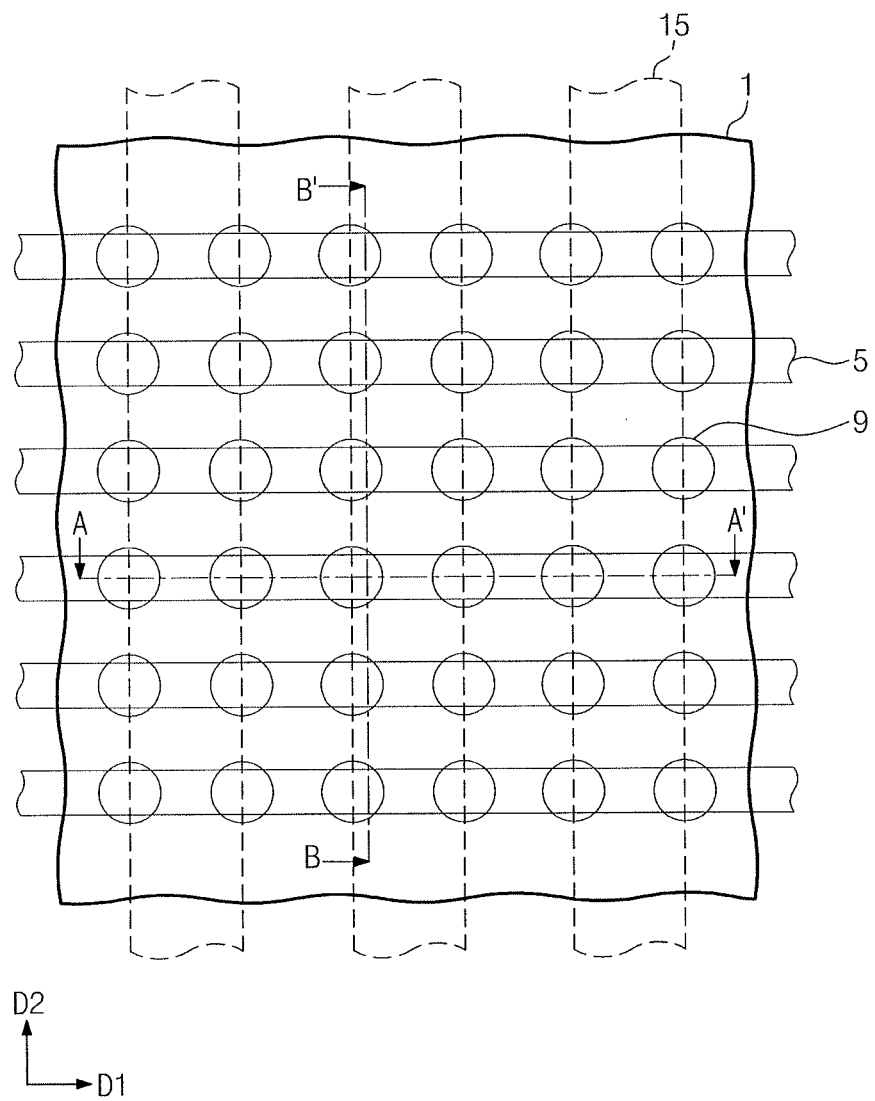
Figure 4B:
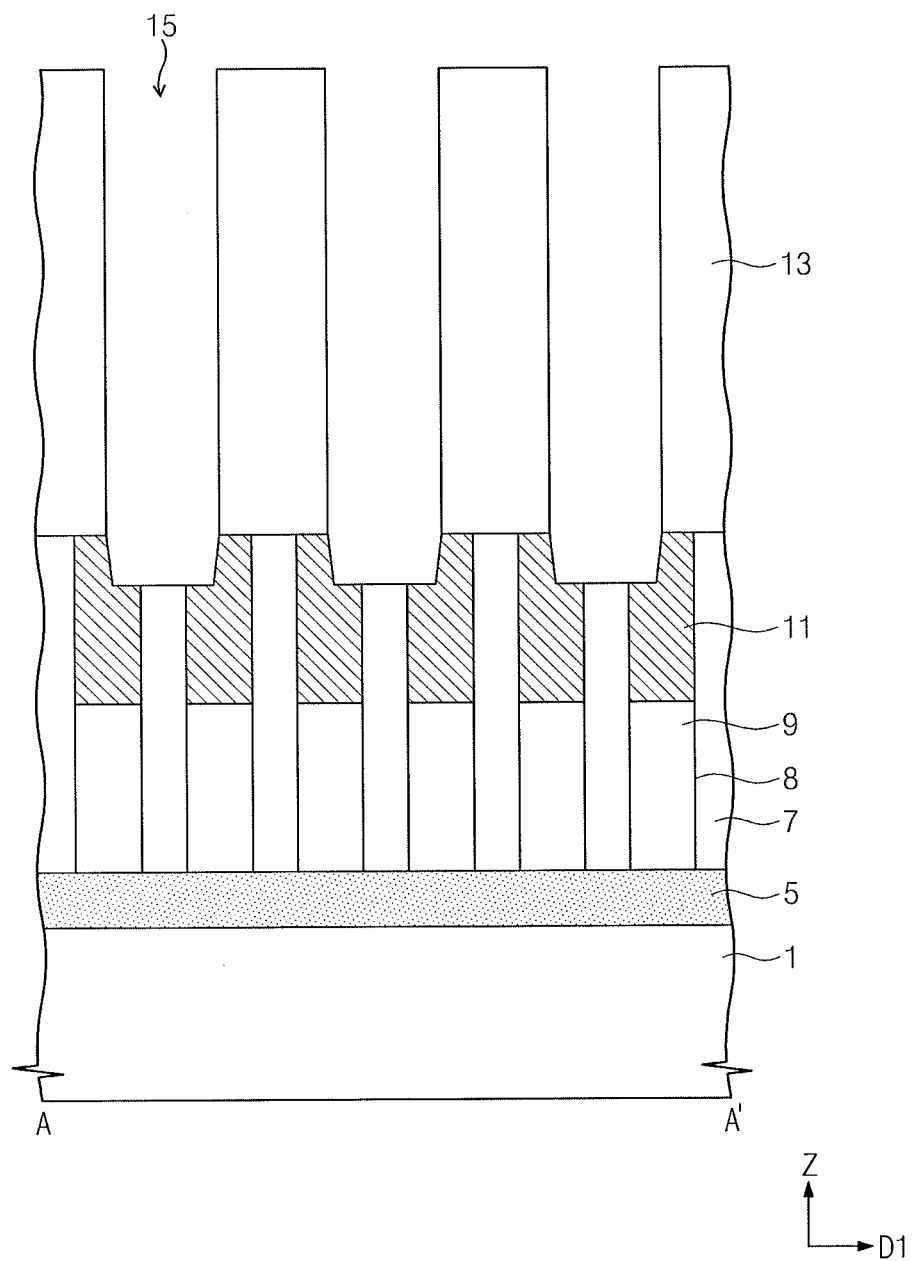
Figure 4C:
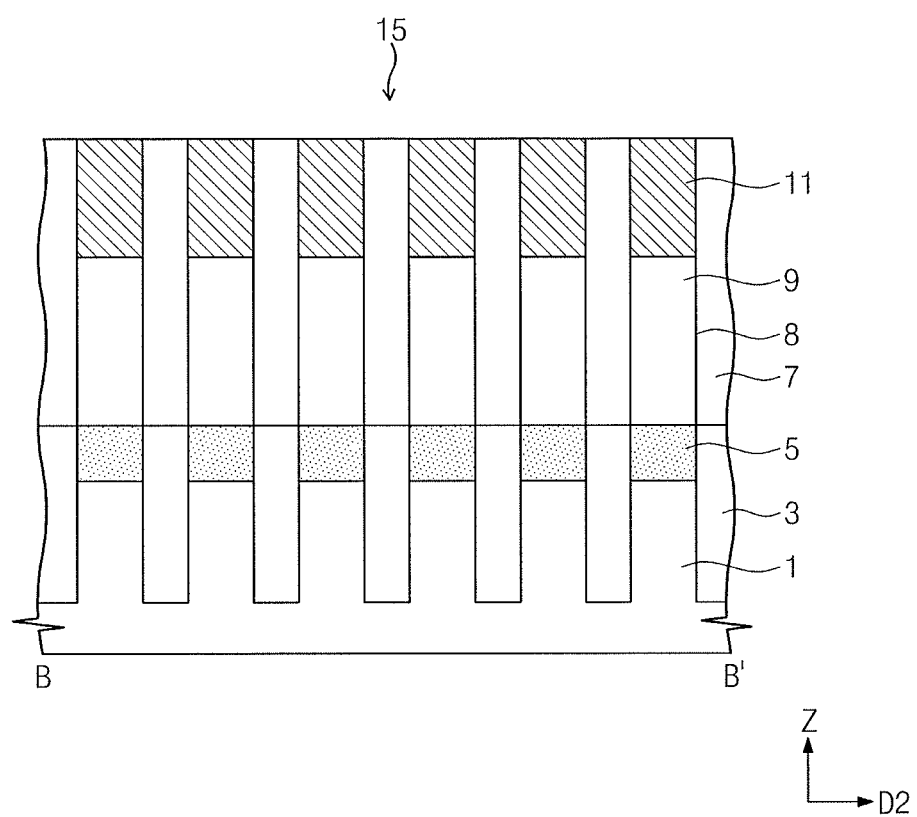

Referring to FIGS. 4A, 4B, and 4C, the mold layer 13 may be patterned to form grooves 15 having linear shapes extending in a second direction D2. The groove 15 may expose two lower electrode pads 11 adjacent to each other in the first direction D1 simultaneously. When the grooves 15 are formed, portions of the lower electrode pads 11 and portions of the interlayer insulating layer 7 therebetween may be etched. For example, the process of forming the grooves 15 may remove facing edges of the adjacent lower electrode pads 11, while the opposite edges of the adjacent lower electrode pads 11 remain. Therefore, the lower electrode pads 11 may include step portions.

Figure 5A:
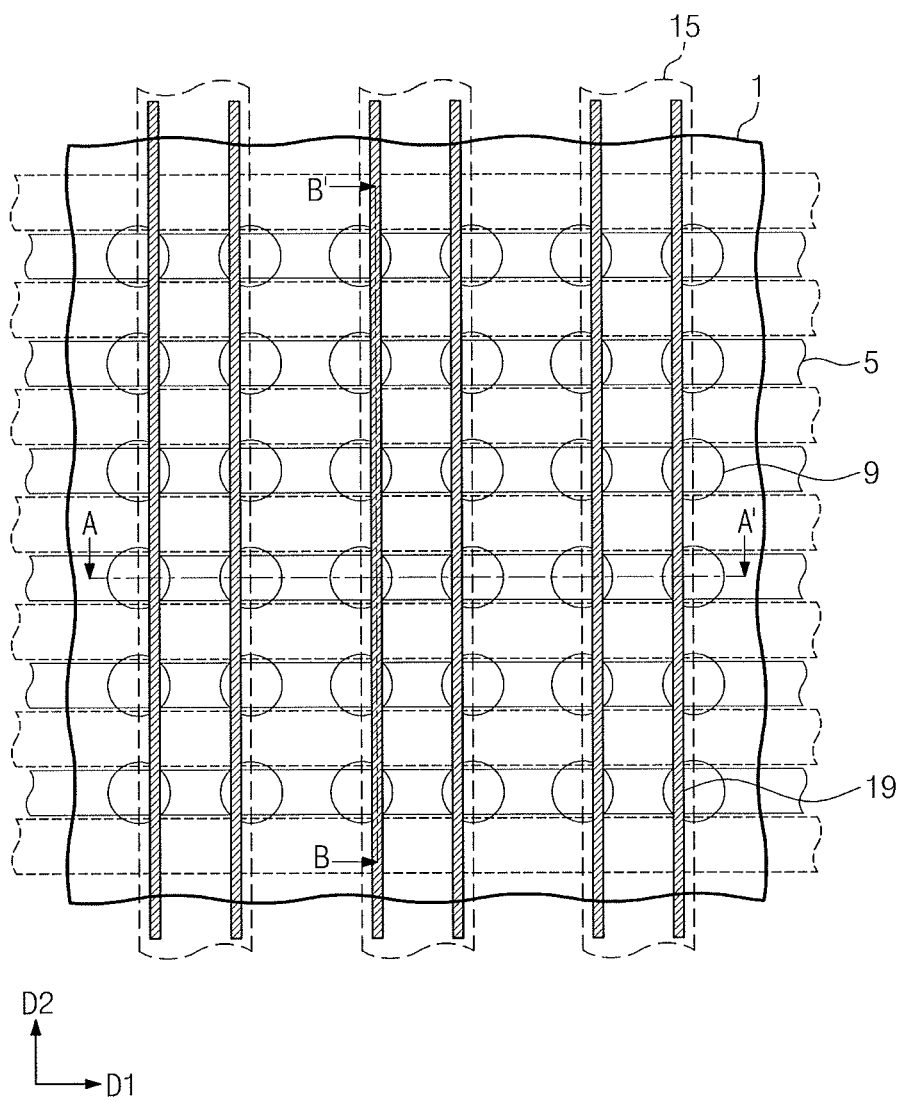
Figure 5B:
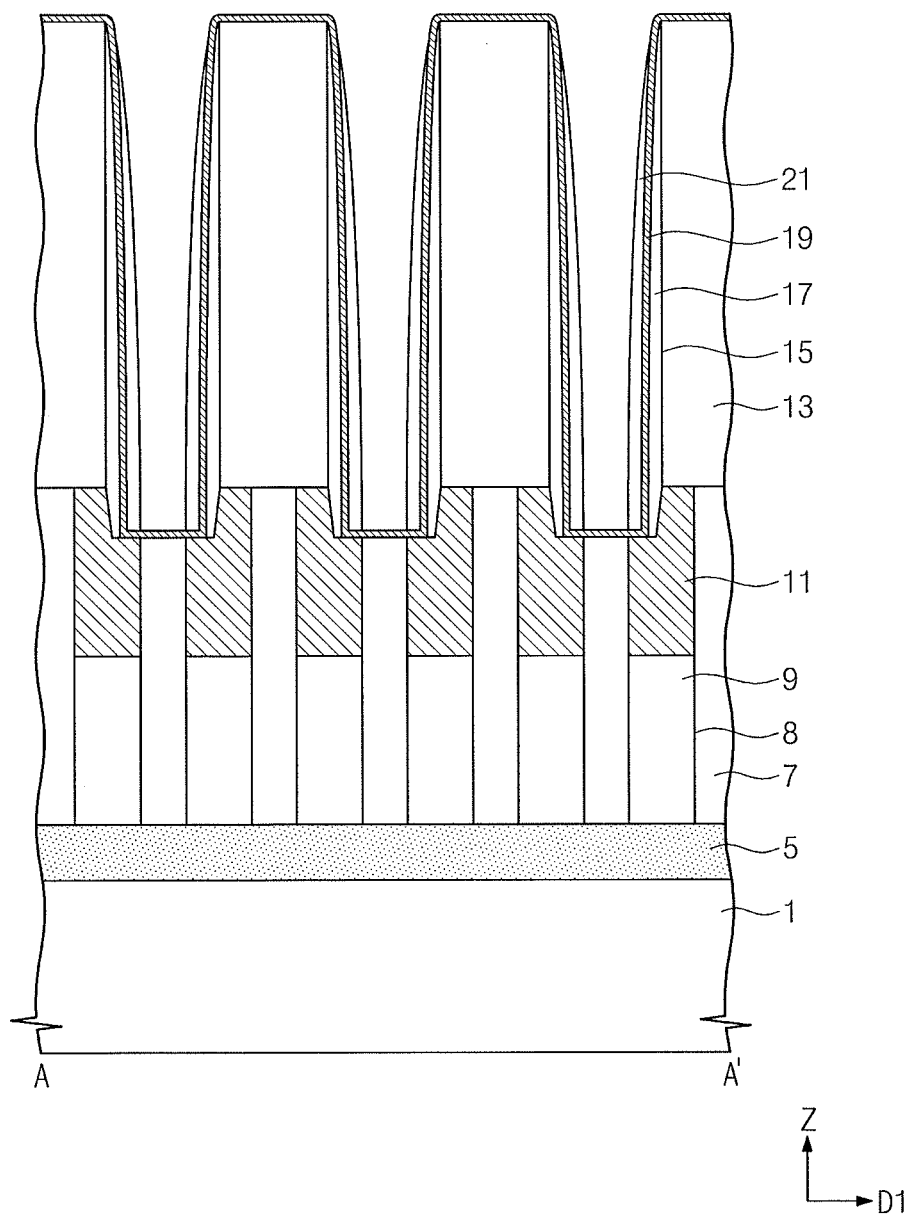
Figure 5C:
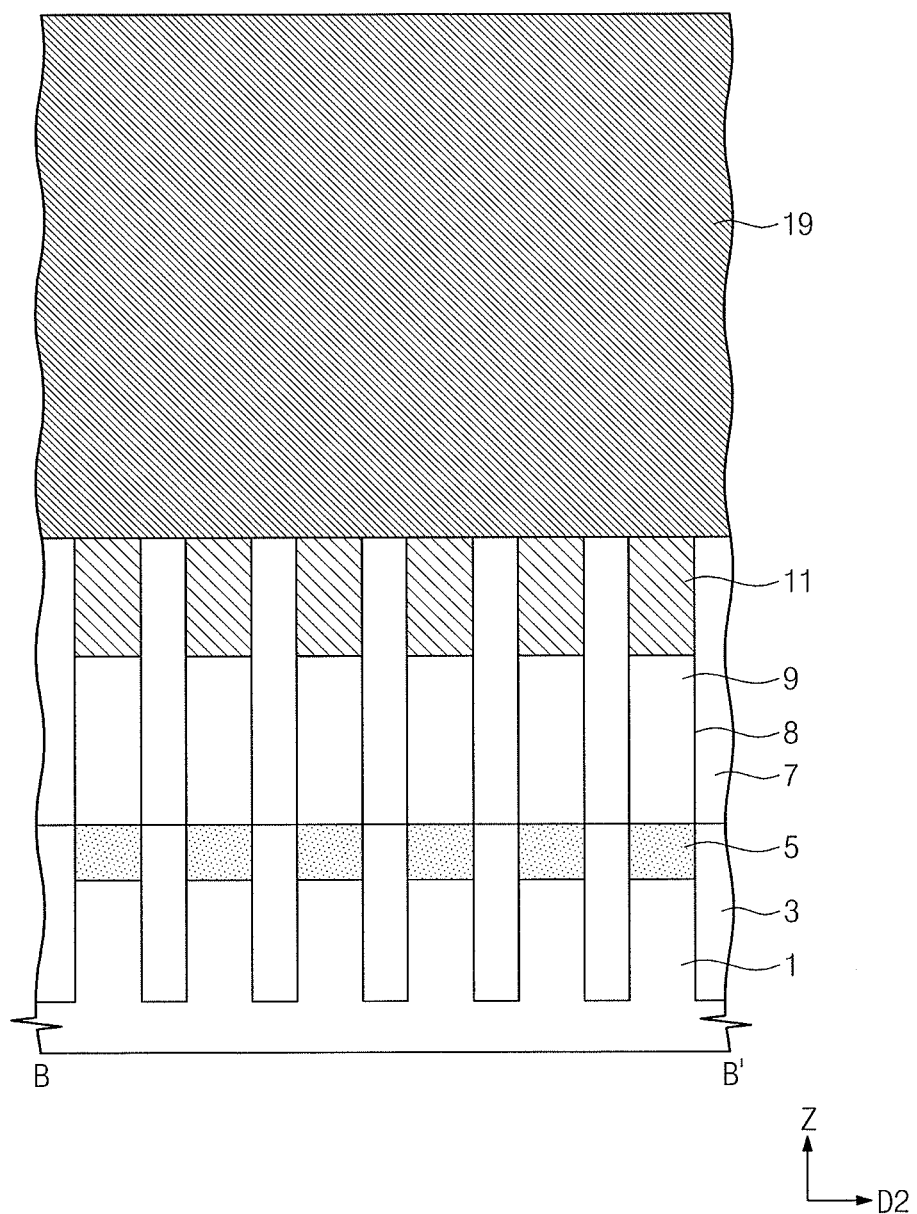

Referring to FIGS. 5A, 5B, and 5C, first spacers 17 may be formed to cover sidewalls of the grooves 15, respectively. For example, a silicon oxide layer may be conformally formed on the substrate 1 by an atomic layer deposition (ALD) process and then the silicon oxide layer may be anisotropically etched to form the first spacers 17, e.g., that cover an entirety of the sidewalls of the grooves 15 and a part of the step portions of the lower electrode pads 11.

After the first spacers 17 are formed, a lower electrode layer 19 may be conformally formed on the substrate 1. For example, the lower electrode layer 19 may be formed of a titanium nitride layer by an ALD process. The lower electrode layer 19 may be formed to conformally cover a top surface of the mold layer 13, a sidewall of each of the first spacers 17, the exposed step portions of the lower electrode pads 11, and the interlayer insulating layer 7 at a bottom of the groove 15.

After the lower electrode layer 19 is formed, second spacers 21 may be formed to cover sidewalls of the lower electrode layer 19 in the groove 15. For example, the second spacer 21 may be formed of a silicon nitride layer. A width along the first direction D1 of the second spacers 21 may increase toward the bottom of the groove 15. The second spacers 21 may cover the parts of the lower electrode layer 19 seated on the step portions of the lower electrode pads 11. The second spacers 21 may be excluded from a central region of the groove 15 so that after forming the second spacers 21 an opening still exists within the groove 15. The opening in the groove 15 may overlap, e.g., may only overlap, the part of the interlayer insulating layer 7 between the lower electrode pads 11.

Figure 6A:
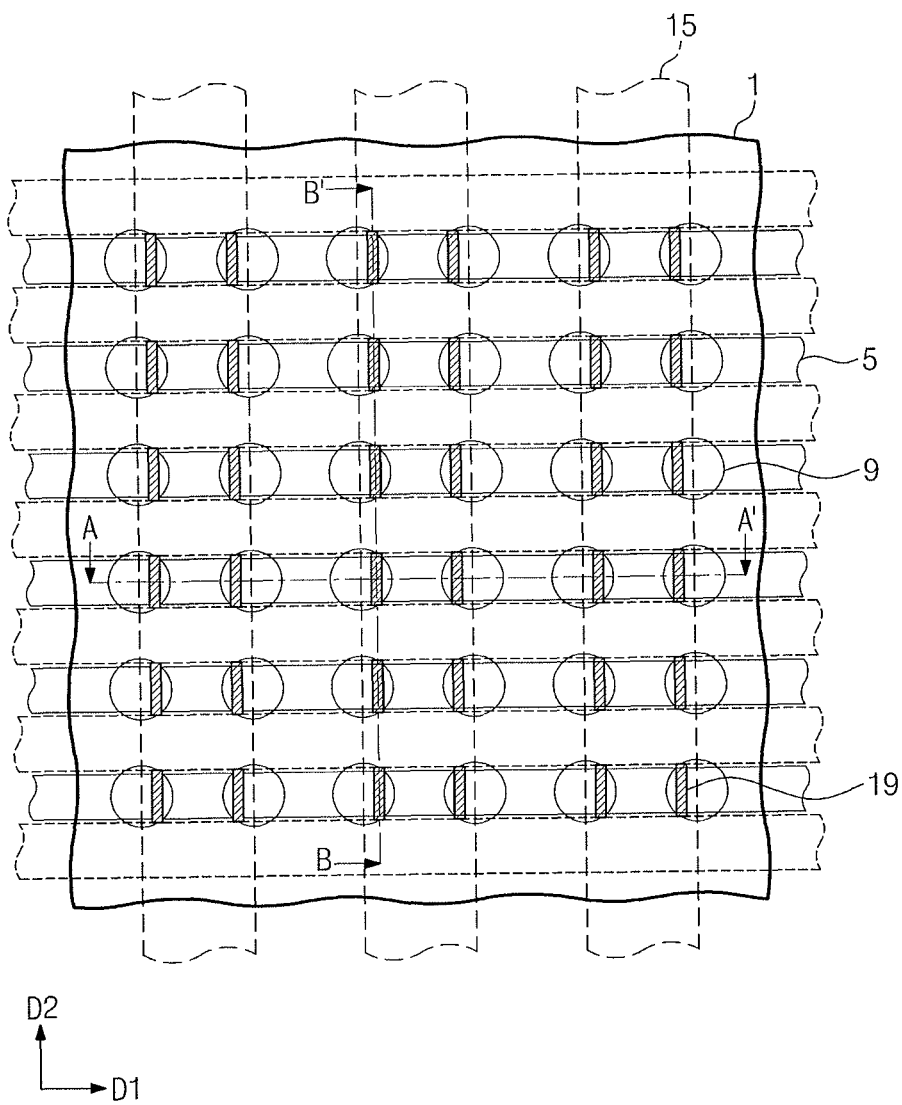
Figure 6B:
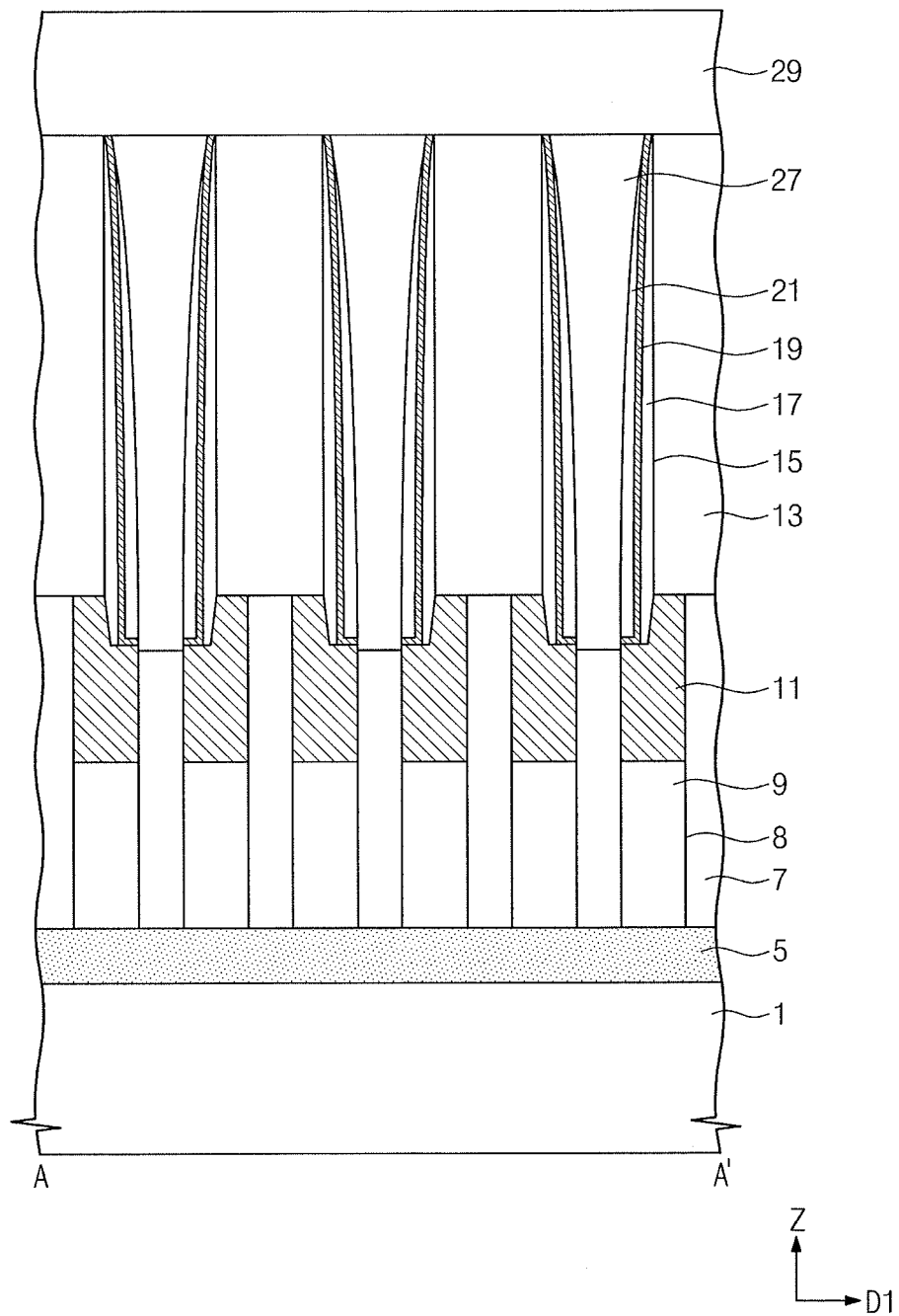
Figure 6C:
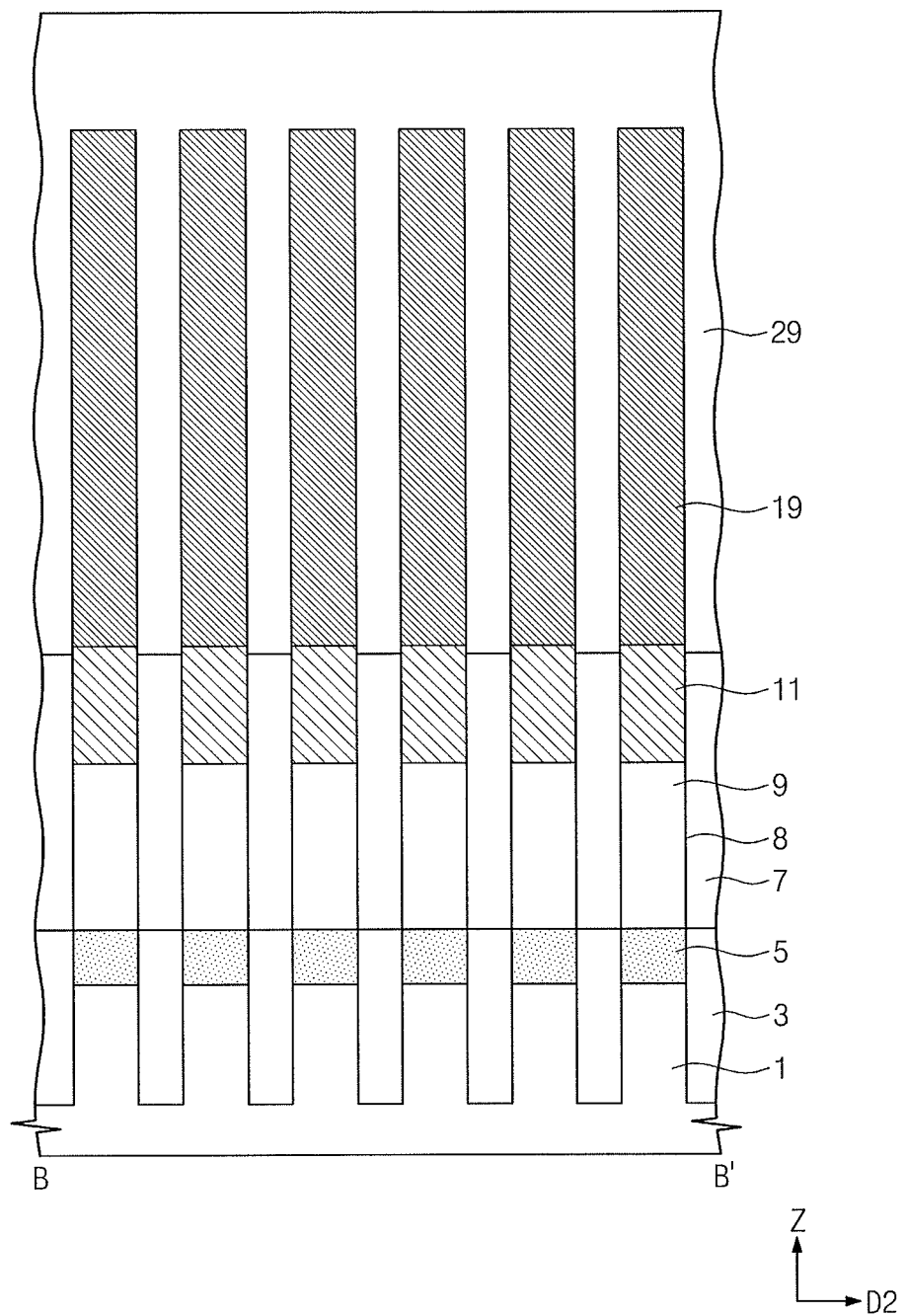

Referring to FIGS. 6A, 6B, and 6C, the lower electrode layer 19 may be patterned using the second spacers 21 as etch masks to expose the top surface of the mold layer 13 and the interlayer insulating layer 7 between the lower electrode pads 11 adjacent to each other. During the etching process, the lower electrode layer 19 between the first spacer 17 and the second spacer 21 may be protected so as to remain on the substrate 1 and to form two discrete lower electrode layers 19 that are spaced apart from each other. The remaining lower electrode 19 extends along opposite sidewalls of the groove 15 in the second direction D2. At this time, a top surface of the interlayer insulating layer 7 between of the lower electrode pads 11 may be lower than a bottom surface of the remaining lower electrode layer 19. Accordingly, a portion of sidewalls of the lower electrode pads 11 may be exposed.

Thereafter, a first filling insulating layer 27 may be formed on an entire surface of the substrate 1 so as to fill the groove 15, e.g., completely fill the groove 15, and to protrude above the mold layer 13. A planarization etching process may be performed on the first filling insulating layer 27 to expose the top surface of the mold layer 13 and to leave the first filling insulating layer 27 in the groove 15.

Further, an etching process using a mask pattern (not shown) may be performed to remove the lower electrode layer 19 not overlapped with the word line 5. At this time, the mold layer 13, the first spacer 17, and the second spacer 21 that are not overlapped, e.g., are in a non-overlapping relationship, with the word line 5 may be etched to expose the interlayer insulating layer 7 thereunder. Thus, lower electrodes 19 are formed to be in contact with the lower electrode pads 11, respectively. Then, a second filling insulating layer 29 may be formed on the substrate so as to fill gap regions between the lower electrodes 19.

Figure 7A:
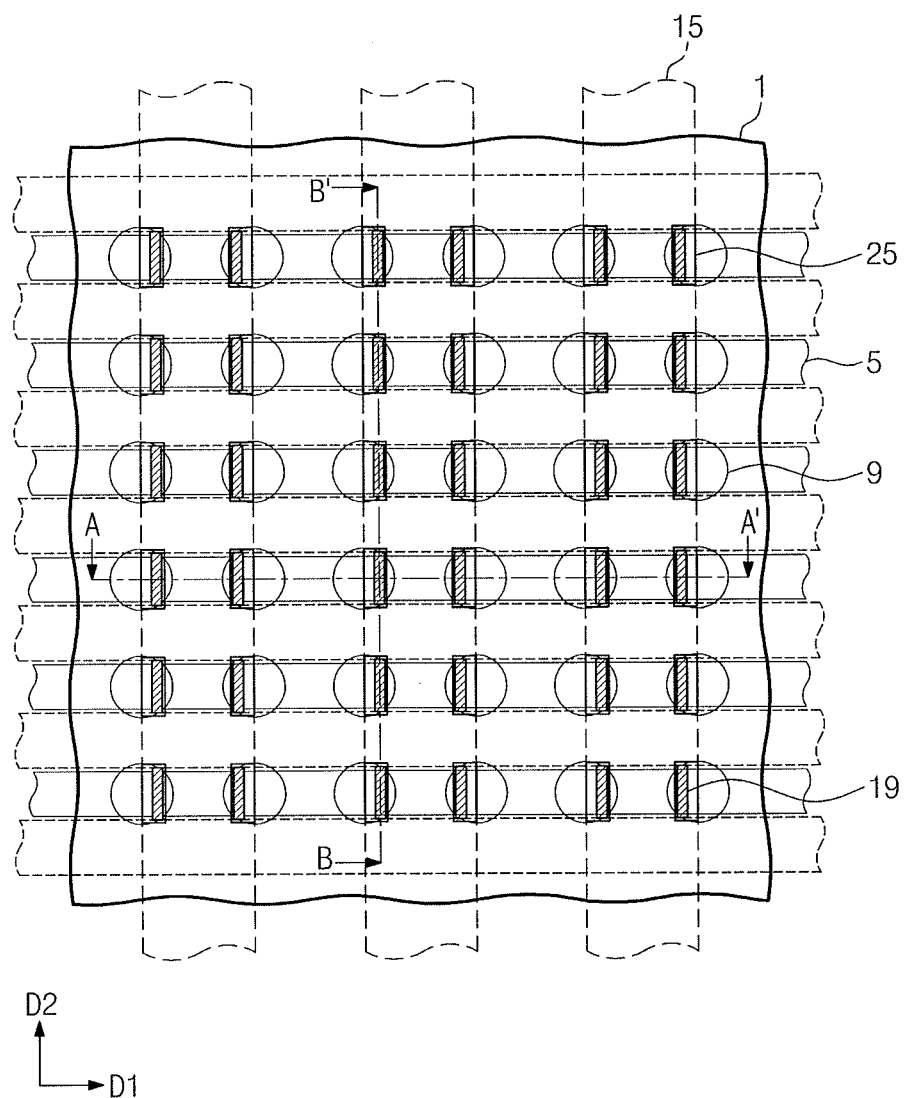
Figure 7B:
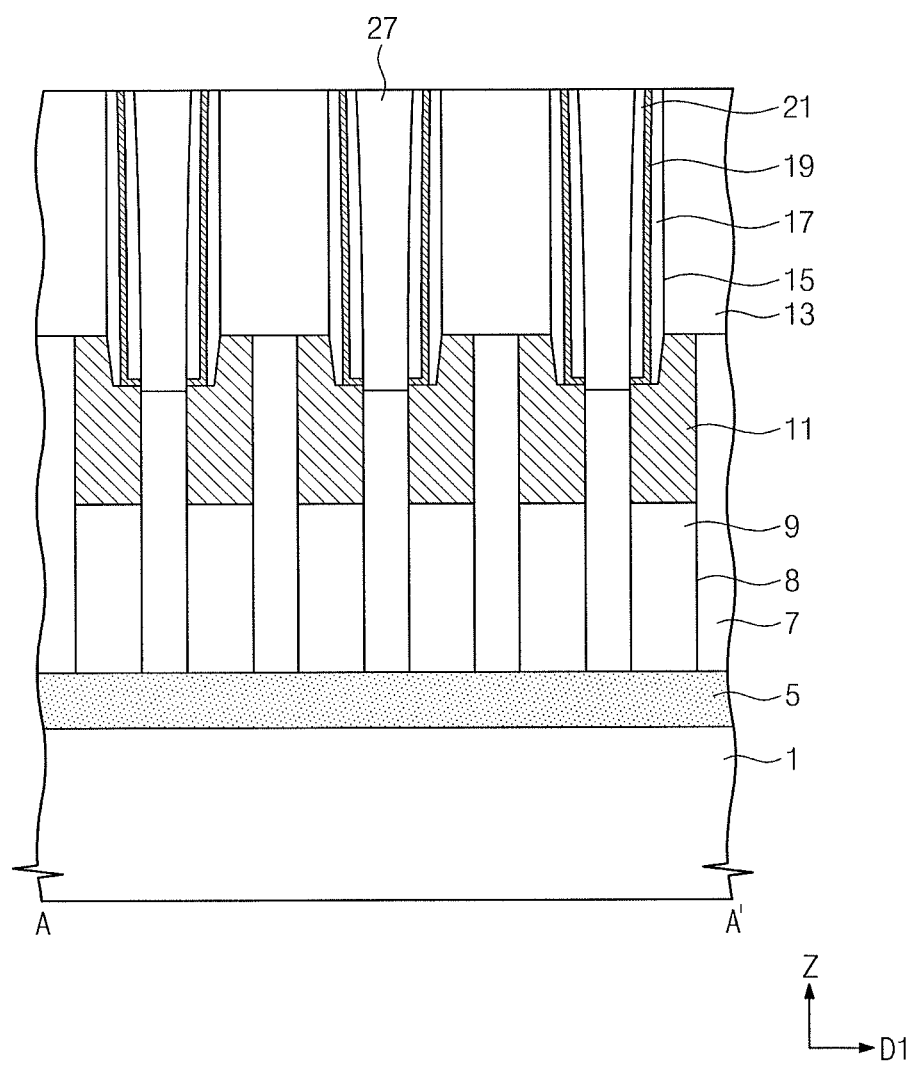
Figure 7C:
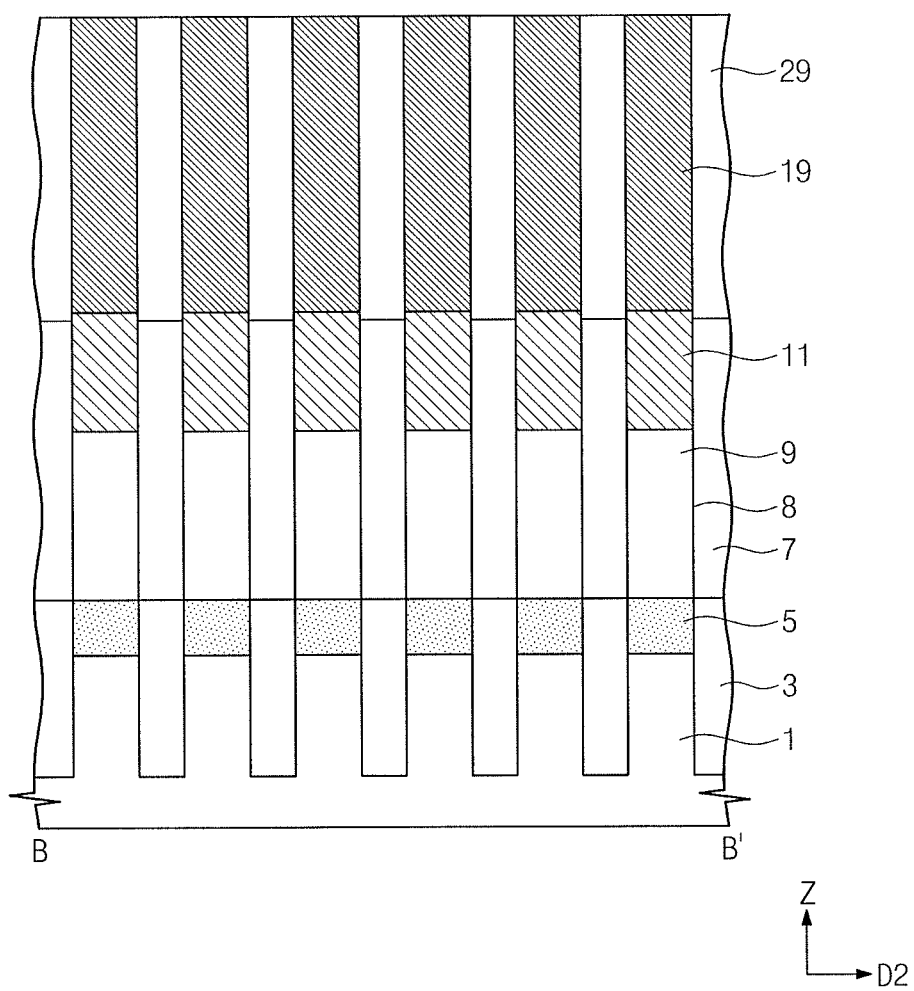

Referring to FIGS. 7A, 7B, and 7C, a planarization etching process may be performed to remove the second filling insulating layer 29 on the mold layer 13 and to leave the second filling insulating layer 29 between the lower electrodes 19. And then the planarization etching process may be continuously performed to remove upper portions of the mold layer 13, the first spacer 17, the lower electrode 19, the second spacer 21, the first filling insulating layer 27, and the second filling insulating layer 29. At this time, a thickness (or a width) of each of the first spacer 17, the lower electrode 19, and the second spacer 21, which are not removed, may be substantially uniform along a height thereof.

Figure 7D:
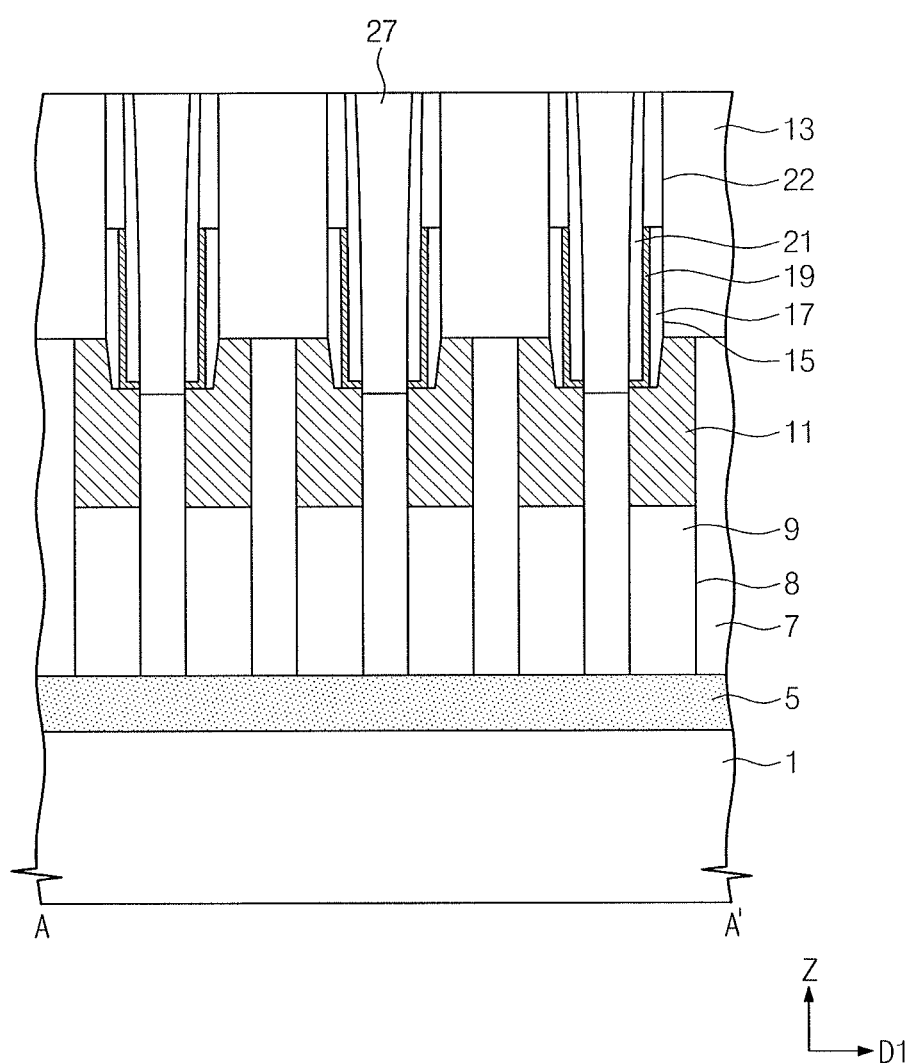
Figure 7E:
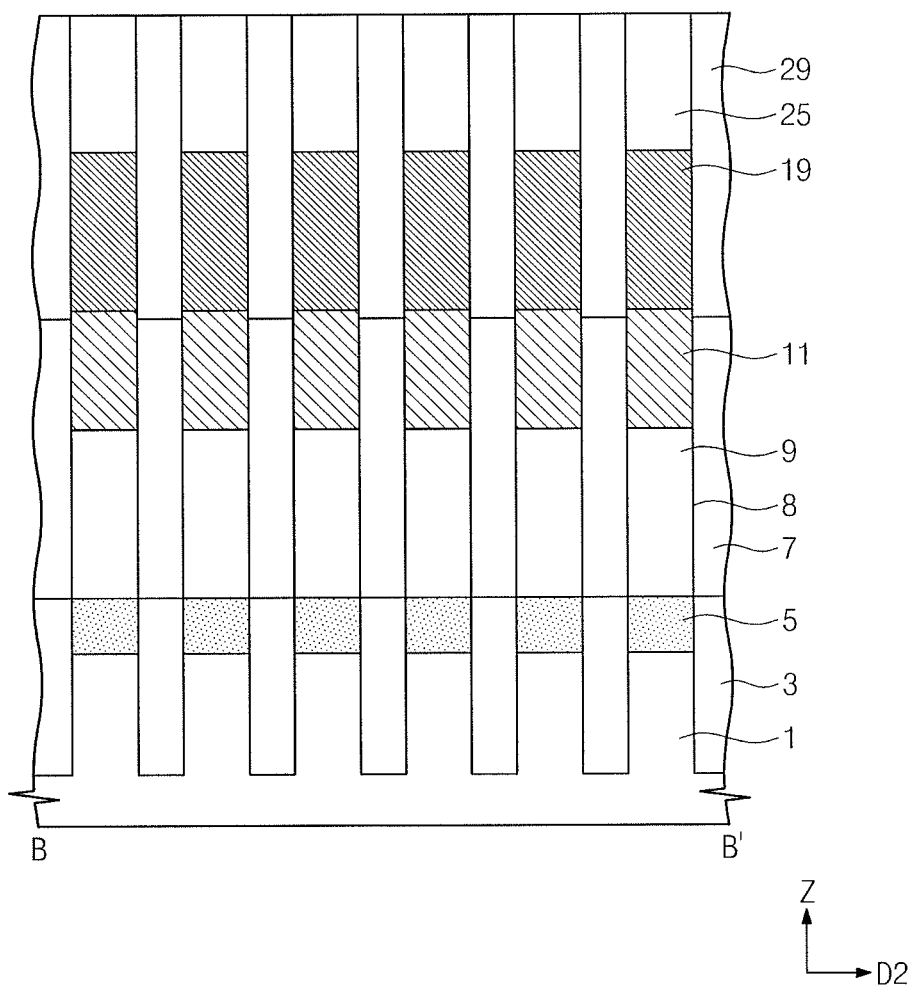

Referring to FIGS. 7A, 7D, and 7E, an upper portion of the first spacer 17 may be partially recessed to expose upper sidewalls of the mold layer 13 and the lower electrode 19. And an upper portion of the lower electrode 19 may be partially recessed to expose an upper sidewall of the second spacer 21. For example, a recessed degree of the first spacer 17 may be substantially equal to a recessed degree of the lower electrode 19, such that a top surface of the recessed first spacer 17 may be substantially coplanar with a top surface of the recessed lower electrode 19. A variable resistance layer may be formed on an entire surface of the substrate 1 so as to fill the recessed region 22 of the first spacer 17 and the lower electrode 19. And then the variable resistance layer may be planarized to form a variable resistance pattern 25 in the recessed region 22. Thus, top surfaces of the variable resistance pattern 25, the mold layer 13, the second spacer 21, the first filling insulating layer 27, and the second filling insulating layer 29 may be exposed. The top surface of the variable resistance pattern 25 may be substantially coplanar with the top surfaces of the mold layer 13, the second spacer 21, the first filling insulating layer 27, and the second filling insulating layer 29.

Figure 8A:
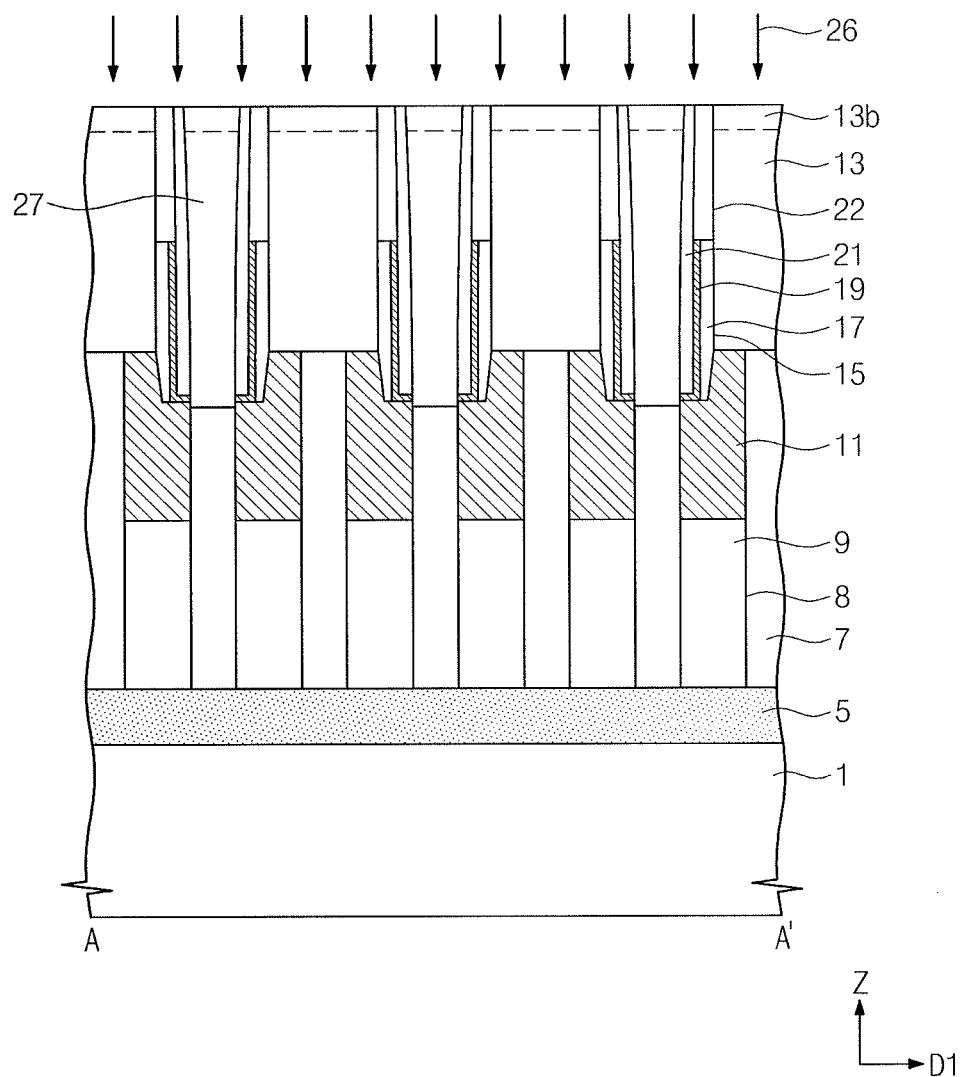
Figure 8B:
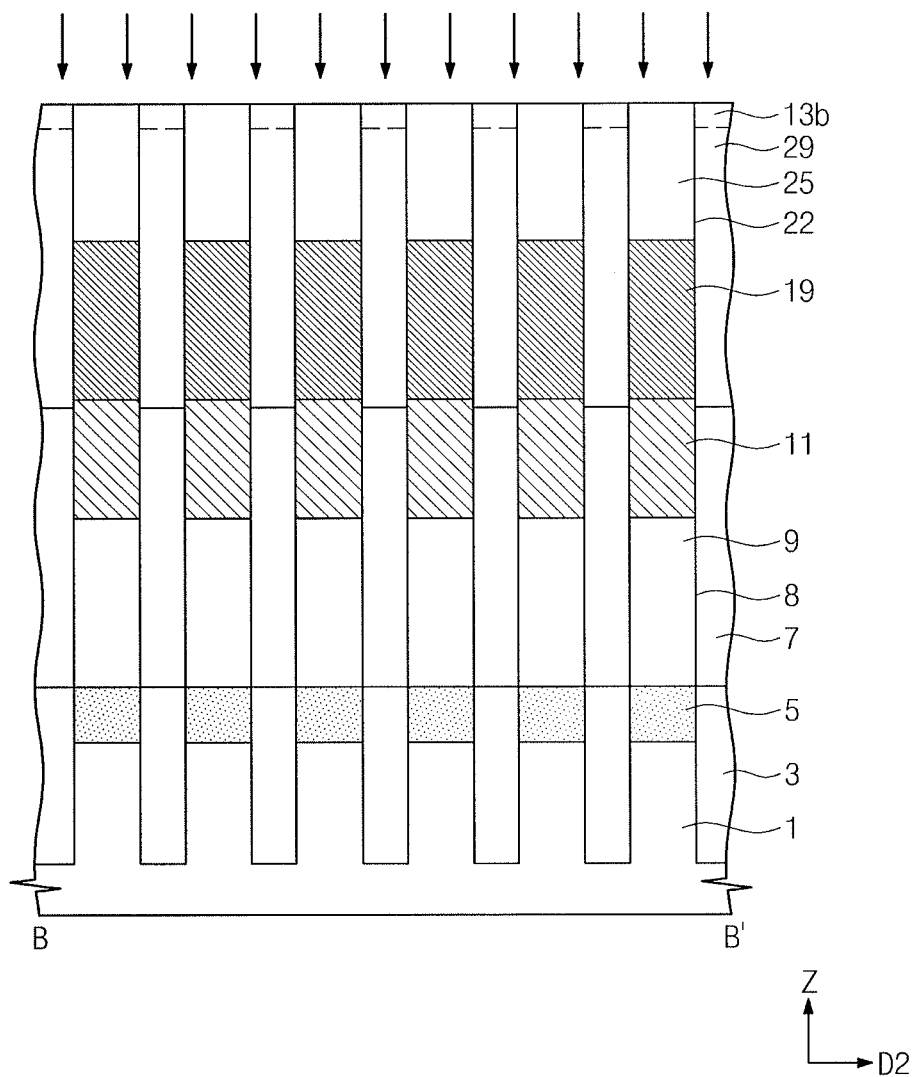

Referring to FIGS. 8A and 8B, top end portions of the exposed mold layer 13, second spacer 21, first filling insulating layer 27, and second filling insulating layer 29 may be converted into a sacrificial layer 13b and then the sacrificial layer 13b may be removed. The sacrificial layer 13b may be formed of, e.g., a silicon oxide layer. For example, the exposed top surfaces of the mold layer 13, second spacer 21, first filling insulating layer 27, and second filling insulating layer 29 may be treated by a hydrogen plasma 26, so that combination of silicon and nitrogen of the silicon nitride layer of the mold layer 13, second spacer 21, first filling insulating layer 27, and second filling insulating layer 29 may be broken to separate the nitrogen from the silicon.

Treating the top surface of the mold layer 13 by the hydrogen plasma may include supplying a hydrogen gas and an inert gas to convert the hydrogen gas into a plasma state. The hydrogen gas may be supplied with a content ratio within a range of 0.1 volume % to 99 volume % with respect to the total amount of the hydrogen gas and the inert gas. The silicon separated from the nitrogen may react with oxygen in an air so as to be converted into a silicon oxide layer. A thickness of the generated silicon oxide layer may be changed depending on intensity and a treating time of the hydrogen plasma 26. For example, the top surface of the variable resistance pattern 25 may be slightly oxidized. However, the top surface of the variable resistance pattern 25 may be merely oxidized as compared with the amount of the silicon oxide layer.

Thereafter, the sacrificial layer 13b (e.g., the silicon oxide layer) may be removed. A slight oxide layer, which may be generated on the top surface of the variable resistance pattern 25, may also be removed.

Referring to FIGS. 2A, 2B, and 2C again, since the sacrificial layer 13b is removed, top surfaces of the mold layer 13, second spacer 21, first filling insulating layer 27, and second filling insulating layer 29 may be lowered, and upper sidewalls of the variable resistance pattern 25 may be exposed. For example, an upper portion of may be protruded from the top surfaces of the mold layer 13, second spacer 21, first filling insulating layer 27, and second filling insulating layer 29.

Thereafter, an upper electrode layer may be stacked and then patterned to form an upper electrode 31 in contact with the top surface and the upper sidewalls of the variable resistance pattern 25. Even though not shown in the drawings, a bit line may be formed to be in contact with the upper electrode 31. The upper electrode 31 may have a plurality of indentations 31A therein that correspond to the space of the top surface and the upper sidewalls of the variable resistance pattern 25. For example, the top surface of the upper electrode 31 may be substantially flat so that the plurality of indentations 31A have a surface that corresponds to the substantially flat top surface of the upper electrode 31. Accordingly, an upper portion of the variable resistance pattern 25 may be housed within, e.g., completely within, one of the indentations 31A.

FIGS. 9 to 12 are cross-sectional views of a modified example of a method of forming a variable resistance memory device of FIG. 2B.

Figure 9:
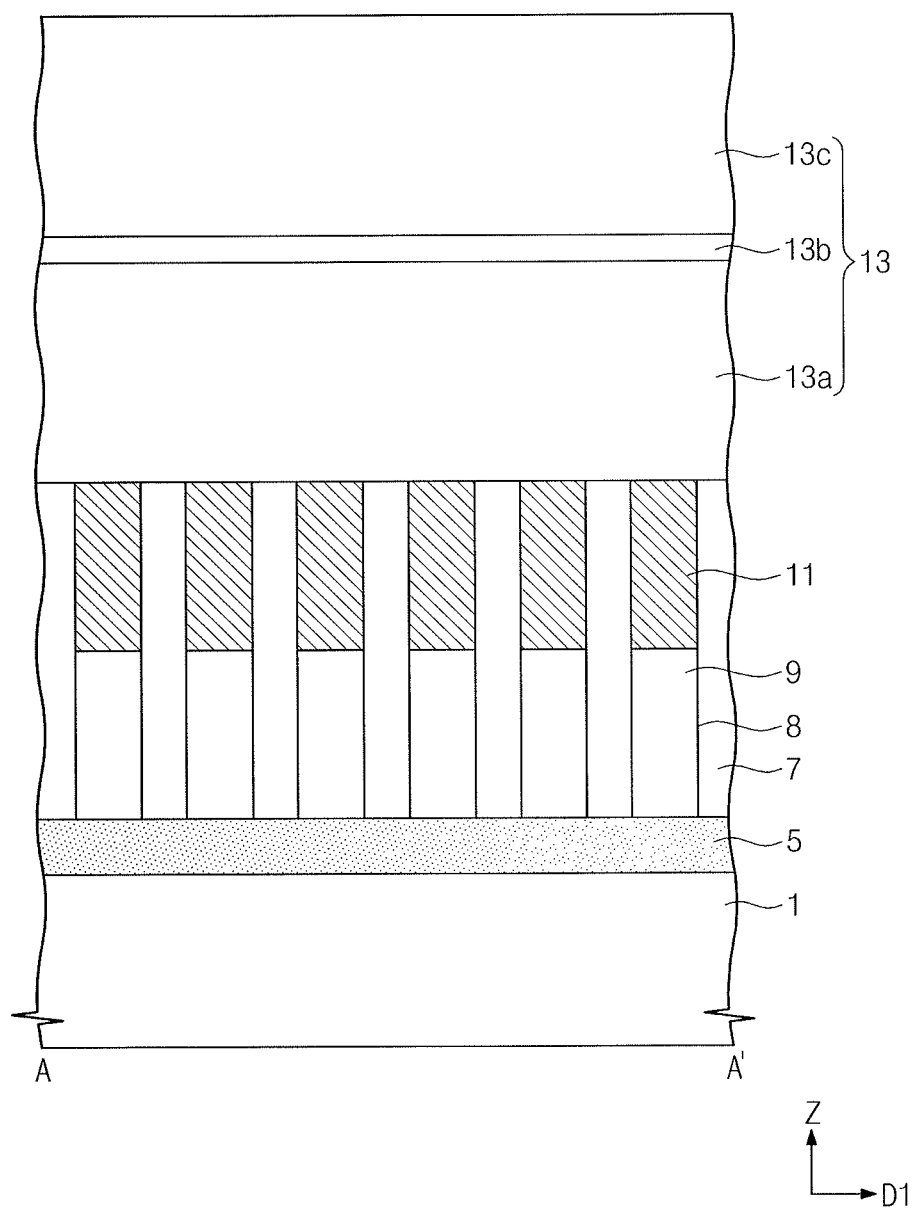
FIGS. 9 to 12 illustrate cross-sectional views of a modified example of stages in a method of forming the variable resistance memory device as shown in FIG. 2B.

Referring to FIG. 9, a mold layer 13 may include a first mold layer 13a, a sacrificial layer 13b, and a second mold layer 13c that are sequentially stacked. For example, when the mold layer is formed on the interlayer insulating layer 7 in the step of FIG. 3B, the mold layer 13a, the sacrificial layer 13b, and the second mold layer 13c may be sequentially stacked. The first and second mold layers 13a and 13c may be formed of a material having the same etch rate as the second spacer 21 and the first and second filling insulating layers 27 and 29. The first and second mold layers 13a and 13c may be formed of the same material as the second spacer 21 and the first and second filling insulating layers 27 and 29. The sacrificial layer 13b may be formed of a material having an etch selectivity with respect to the first and second molder layers 13a and 13c. For example, the first and second mold layers 13a and 13c may be formed of silicon nitride layers and the sacrificial layer 13b may be formed of a silicon oxide layer.

Figure 10:
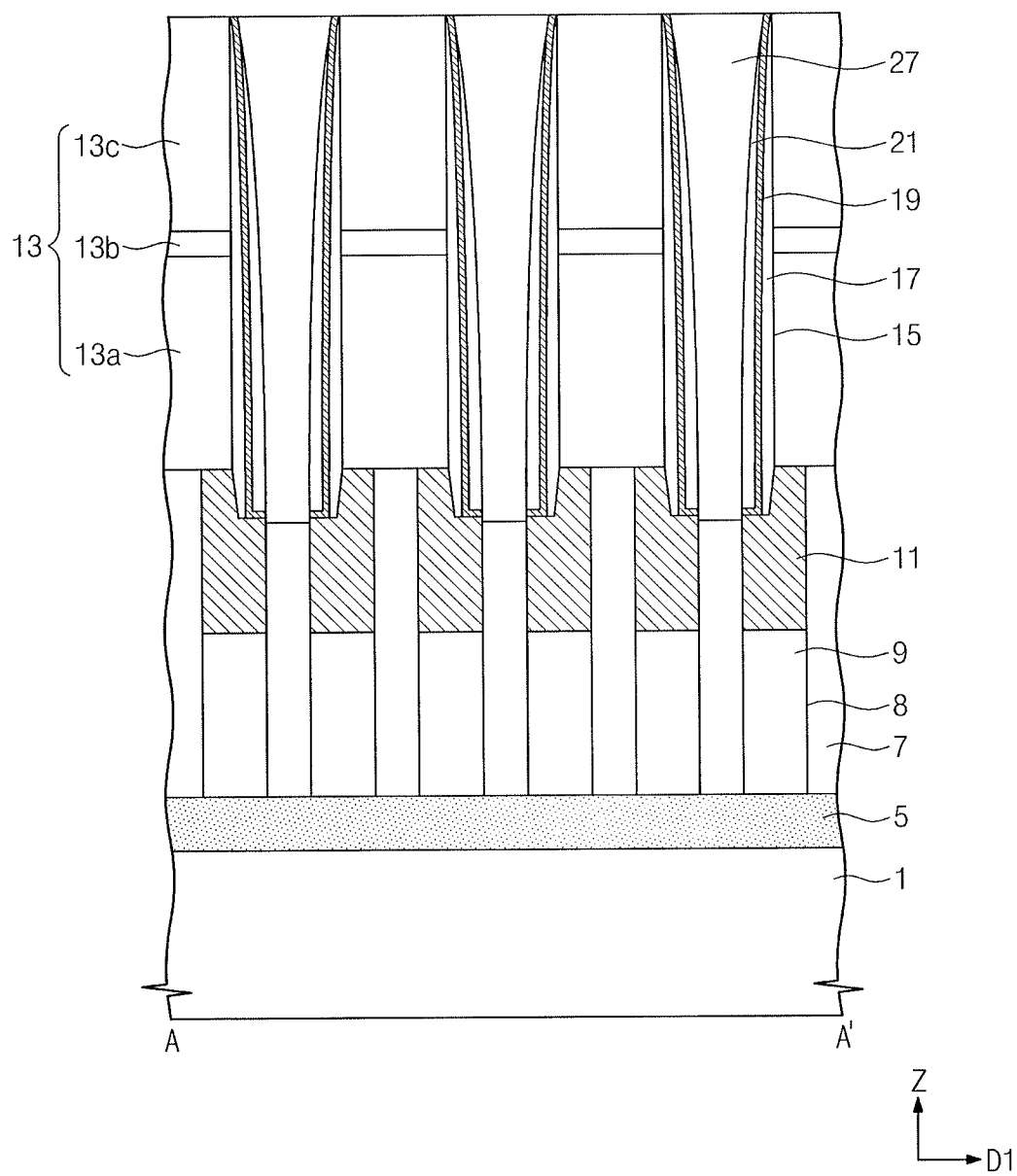

Referring to FIG. 10, the second mold layer 13c, the sacrificial layer 13b, and the first mold layer 13a may be successively patterned to form grooves 15. A first spacer 17, a lower electrode layer 19, and a second spacer 21 may be formed to sequentially cover a sidewall of the groove 15. And then a first filling insulating layer 27 may be formed to fill the groove 15.

Even though not shown in the drawings, as illustrate in FIG. 6C, the lower electrode layer 19 not overlapped with the word line 5 may be removed. At this time, the first mold layer 13a, the sacrificial layer 13b, the second mold layer 13c, the first spacer 17, and the second spacer 21 which are not overlapped with the word line 5 may be removed to expose the interlayer insulating layer 7 thereunder. Thus, lower electrodes 19 may be formed to be in contact with the lower electrode pads 11, respectively. And then the second filling insulating layer 29 may be formed on the substrate 1 so as to fill a gap region between the lower electrodes 19.

Figure 11:
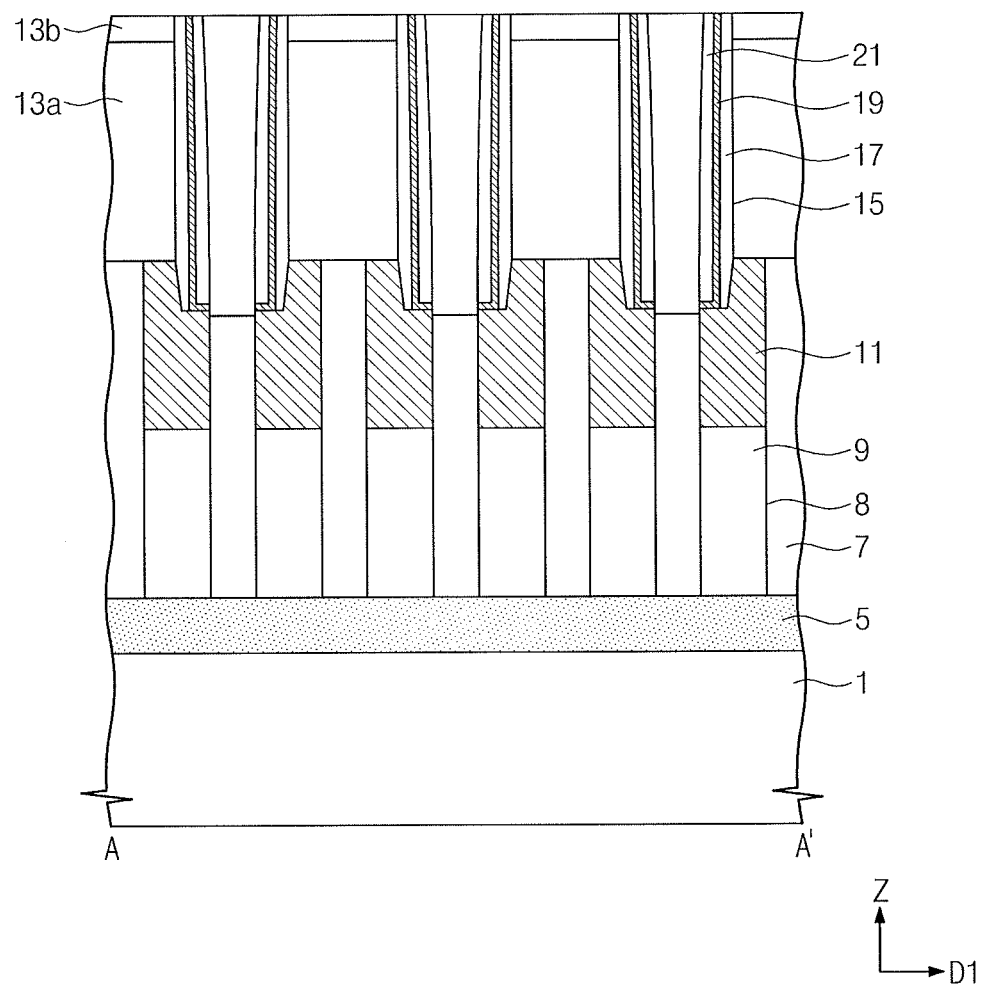

Referring to FIG. 11, a planarization etching process may be performed to remove the second mold layer 13c, first spacer 17, lower electrode 19, second spacer 21, first filling insulating layer 27, and second filling insulating layer 29 which are higher than a top surface of the sacrificial layer 13b. The sacrificial layer 13b may be used as an etch stop layer of the planarization etching process. A thickness (or a width) of each of the first spacer 17, the lower electrode 19, and second spacer 21, which are not removed, may be substantially uniform along a height thereof.

Figure 12:
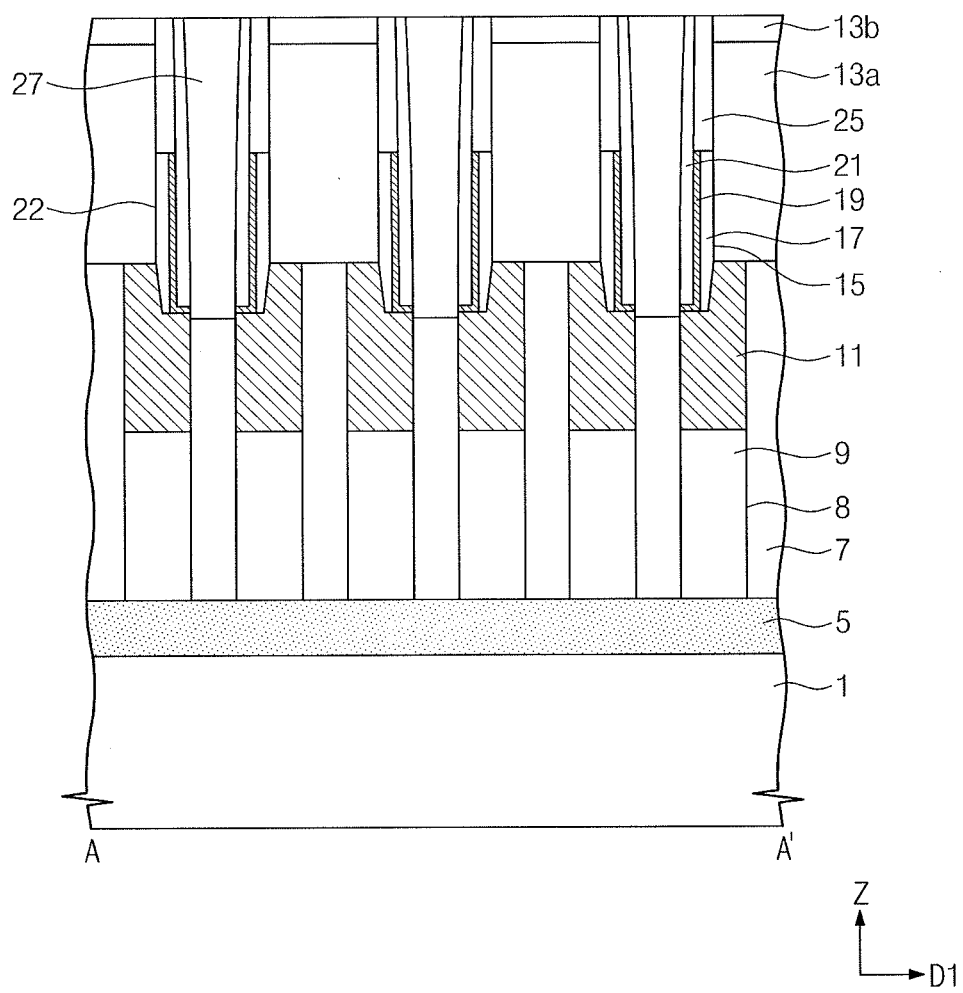

Referring to FIG. 12, an upper portion of the first spacer 17 may be partially recessed to expose upper sidewalls of the first mold layer 13a and the lower electrode 19. An upper portion of the lower electrode 19 may be partially recessed to expose an upper sidewall of the second spacer 21. For example, a recessed degree of the first spacer 17 may be substantially equal to a recessed degree of the lower electrode 19, such that a top surface of the recessed first spacer 17 may be substantially coplanar with a top surface of the recessed lower electrode 19. A variable resistance layer may be formed on an entire surface of the substrate 1 so as to fill the recessed region 22 of the first spacer 17 and the lower electrode 19. And then the variable resistance layer may be planarized to form a variable resistance pattern 25 in the recessed region 22. Thus, top surfaces of the variable resistance pattern 25, the first mold layer 13a, the second spacer 21, the first filling insulating layer 27, and the second filling insulating layer 29 may be exposed. The top surface of the variable resistance pattern 25 may be substantially coplanar with the top surfaces of the first mold layer 13a, the second spacer 21, the first filling insulating layer 27, and the second filling insulating layer 29.

Referring to FIG. 2B again, the first mold layer 13a of FIG. 12 corresponds to the mold layer 13 of FIG. 2B. The exposed sacrificial layer 13b is removed. If the sacrificial layer 13b is formed of a silicon oxide layer, the sacrificial layer 13b may be removed by a hydrofluoric acid. Thus, upper sidewalls of the variable resistance pattern 25 are exposed. For example, the upper portion of the variable resistance pattern 25 may protrude from the top surfaces of the mold layer 13, the second spacer 21, the first filling insulating layer 27, and the second filling insulating layer 29. Thereafter, an upper electrode layer 31 may be stacked and then patterned to form an upper electrode 31 in contact with the top surface and the upper sidewalls of the variable resistance pattern 25. Even though not shown in the drawings, a bit line may be formed to be in contact with the upper electrode 31.

Other processes of the present modified example may be the same as the processes described with reference to FIGS. 3A to 7E.

Figure 13A:
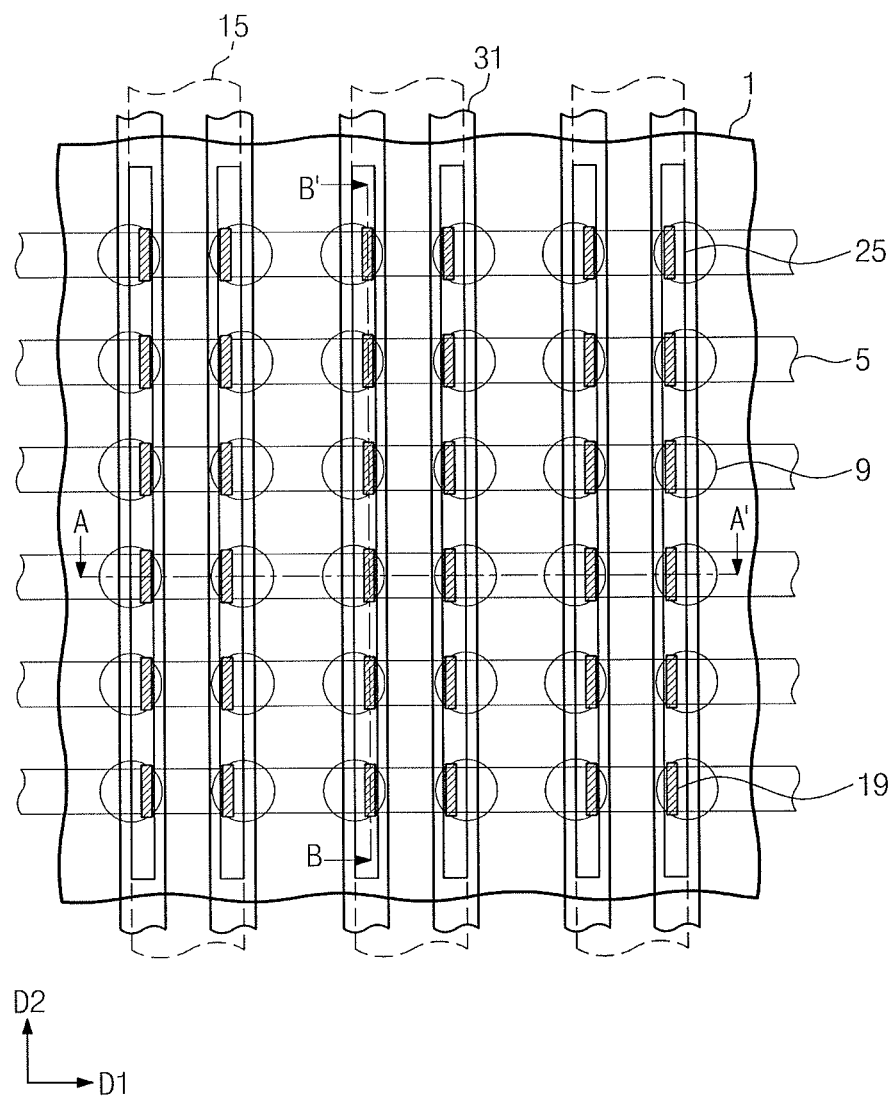
FIG. 13A illustrates a plan view of a variable resistance memory device according to exemplary embodiments.
Figure 13B:
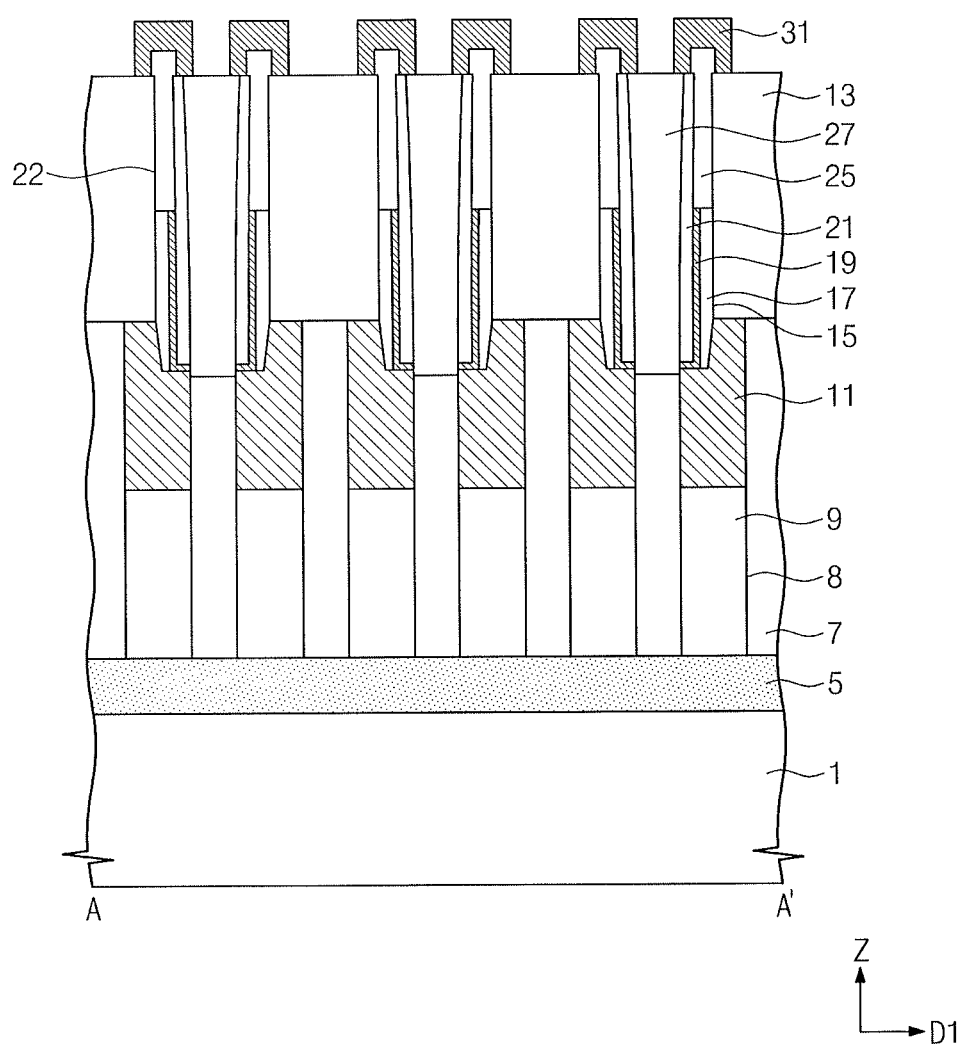
FIGS. 13B and 13C illustrate cross-sectional views taken along lines A-A' and B-B' of FIG. 13A, respectively.
Figure 13C:
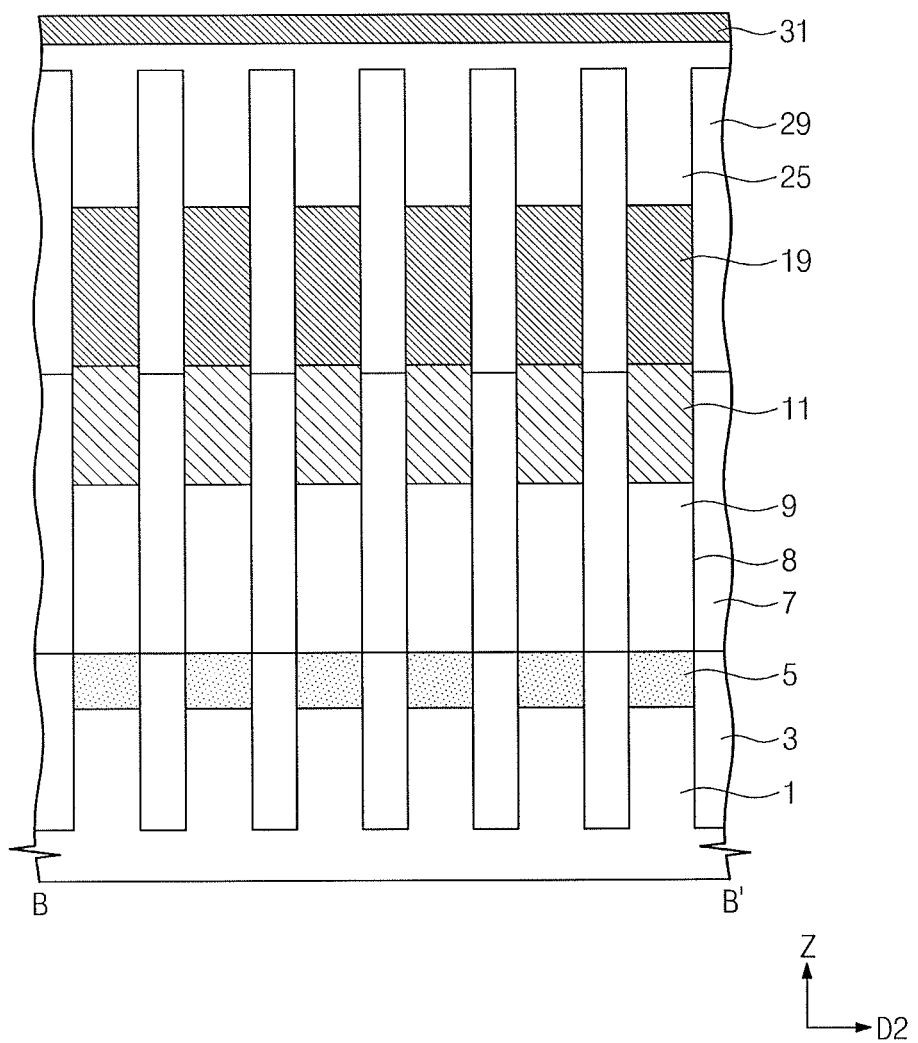

FIG. 13A is a plan view illustrating a variable resistance memory device according to other exemplary embodiments. FIGS. 13B and 13C are cross-sectional views taken along lines A-A' and B-B' of FIG. 13A, respectively.

Referring to FIGS. 13A, 13B, and 13C, in a variable resistance memory device according to an exemplary embodiment, an upper portion of a variable resistance pattern 25 may protrude upwardly from the mold layer 13 and the protruding portion of the variable resistance pattern 25 may extend in the first direction D1, e.g., along a width thereof, may extend in the second direction D2, e.g., along a length thereof, and may extend in the z-axis direction, e.g., a height thereof. The portion of the variable resistance pattern 25 above the mold layer 13 may have a greater width than another portion of the variable resistance pattern 25 directly thereunder. Accordingly, a contact area between the variable resistance pattern 25 and the upper electrode 31 may be further increased.

The portion of the variable resistance pattern 25 protruding above the mold layer 13 may be housed within the upper electrode 31, e.g., within indentations 31A as illustrated in FIGS. 2B and 2C, in the upper electrode 31. For example, the upper electrode 31 may be in contact with a top surface and upper sidewalls of the variable resistance pattern 25. Other components of the variable resistance memory device according to the present embodiment may be the same as described with reference to FIGS. 2A, 2B, and 2C.

Figure 14A:
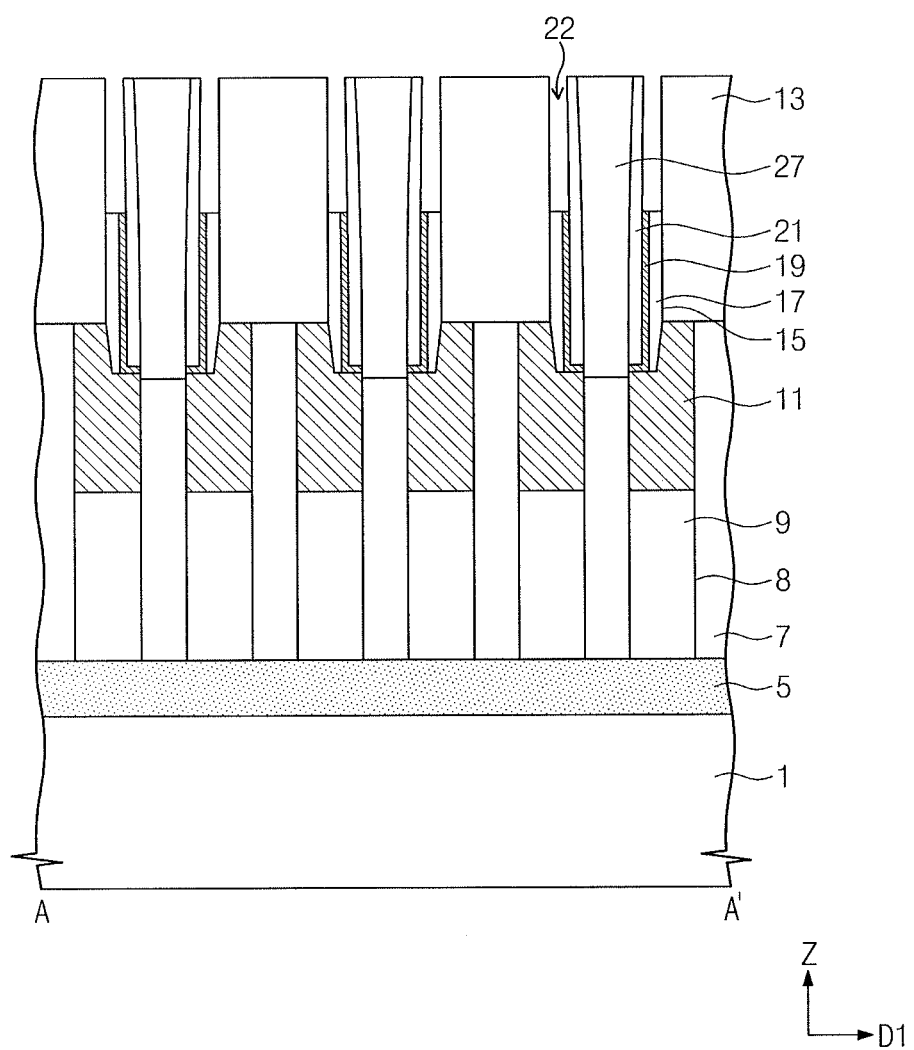
FIGS. 14A and 14B illustrate cross-sectional views depicting stages in a method of forming the variable resistance memory device as shown in FIGS. 13B and 13C, respectively.
Figure 14B:
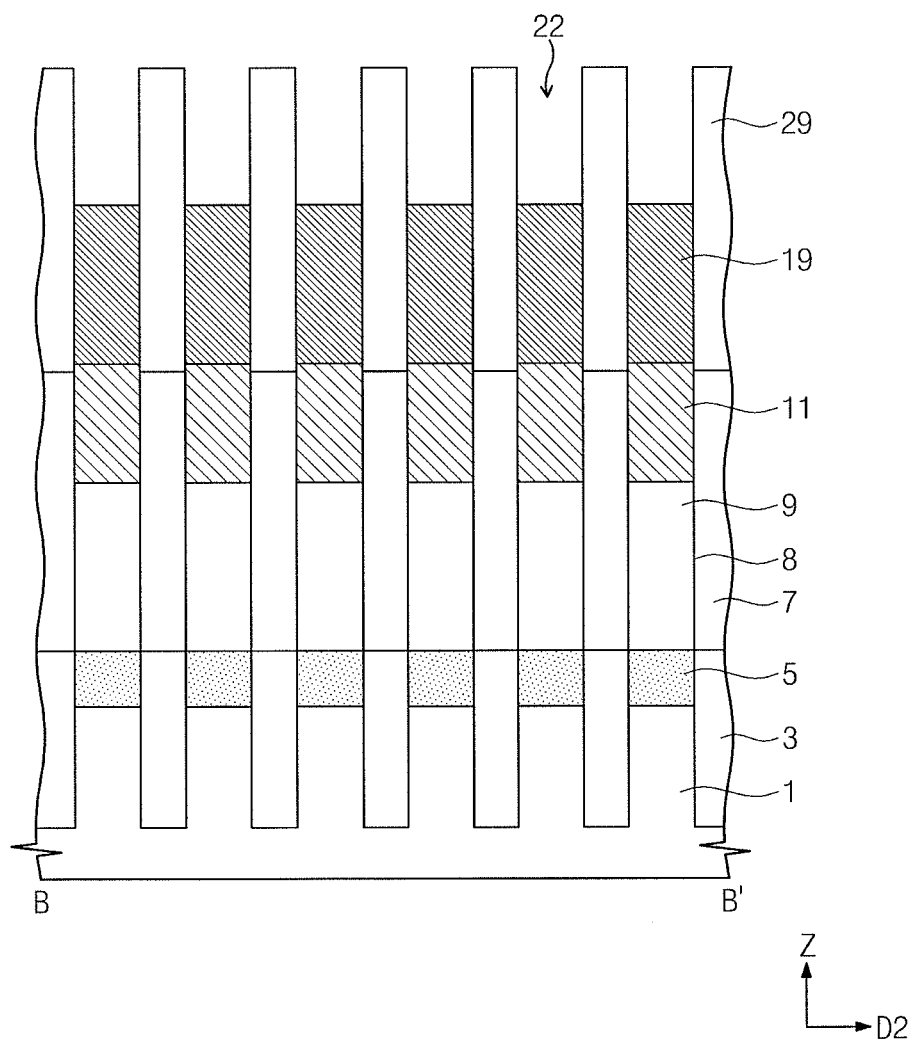

FIGS. 14A and 14B are cross-sectional views illustrating an example of a method of forming a variable resistance memory device of FIGS. 13B and 13C.

Referring to FIGS. 14A and 14B, in the structure of FIGS. 7B and 7C, upper portions of the first spacer 17 and the lower electrode 19 may be respectively recessed to form a recessed region 22.

Referring to FIGS. 13A, 13B, and 13C again, a variable resistance layer may be formed on an entire surface of the substrate 1. The variable resistance layer may be anisotropically etched to form a variable resistance pattern 25 that protrudes upwardly from the mold layer 13 and that extends in the second direction D2. In this case, the process lowering the top surface of the mold layer 13, which is described with reference to FIGS. 8A and 8B or FIGS. 9 to 12, may not be performed. Thereafter, the upper electrode 31 is formed. Other processes of the method according to the present embodiment may be the same as corresponding processes described above.

Figure 15:
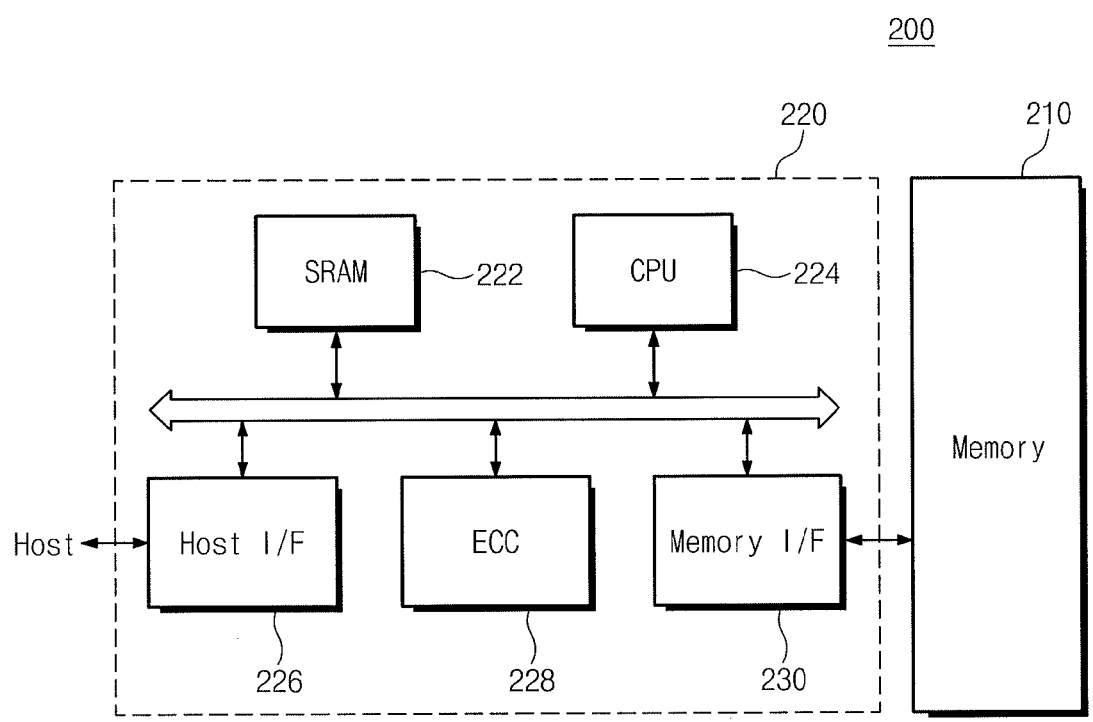
FIG. 15 illustrates a schematic block diagram of a memory card including a variable resistance memory device according to exemplary embodiments.

FIG. 15 is a schematic block diagram illustrating an example of memory cards including variable resistance memory devices according to exemplary embodiments.

Referring to FIG. 15, the variable resistance memory devices according to the aforementioned embodiments may be applied to a memory card 200. For example, the memory card 200 may include a memory controller 220 that controls data communication between a host and a resistive memory device 210. An SRAM device 222 may be used as an operation memory of a central processing unit (CPU) 224. A host interface unit 226 may be configured to include a data communication protocol of the host connected to the memory card 200. An error check and correction (ECC) block 228 may detect and correct errors of data that are read out from the resistive memory device 210. A memory interface unit 230 may interface with the resistive memory device 210. The CPU 224 may perform overall operations for data exchange of the memory controller 220.

The resistive memory device 210 applied to the memory card 200 may include at least one of the variable resistance memory devices according to embodiments.

Figure 16:
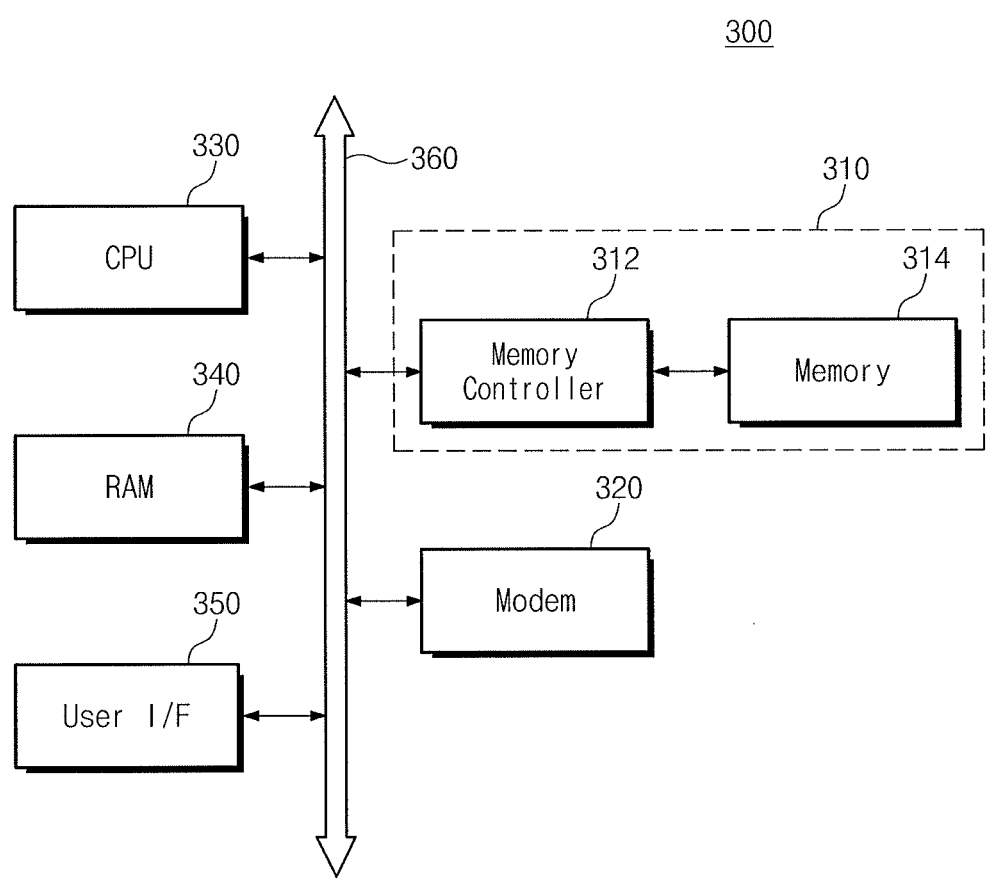
FIG. 16 illustrates a schematic block diagram of a system including a variable resistance memory device according to exemplary embodiments.

FIG. 16 is a schematic block diagram illustrating an example of systems including variable resistance memory devices according to embodiments.

Referring to FIG. 16, an information processing system 30 may include a memory system 310 that includes at least one of the variable resistance memory devices according to embodiments. The information processing system 300 may include a mobile device or a desk top computer. For example, the information processing system 300 may include a Modem 320, a central processing unit (CPU) 330, a RAM 340, a user interface unit 350, which are electrically connected the memory system 310 through a system bus 360. Data processed by the CPU 330 or data inputted from an external system may be stored in the memory system 310. The memory system 310 may include a memory device 314 and a memory controller 312 and may be substantially the same as the memory card 200 described with reference to FIG. 15. The information processing system 300 may further include at least one of a memory card, a solid state disk (SSD), a camera image sensor, and other application chipsets. For example, the memory system 310 may consist of the solid state disk (SSD). For example, the information processing system 300 may stably store massive data in the memory system 310.

By way of summation and review, memory devices using variable resistance materials such as phase-change materials may have a fast operation speed and a structure advantageous to high integration. However, during a process of manufacturing the memory device, a contact area of a top electrode and a corresponding variable resistance material may be reduced. Additionally, during operation of the memory devices, the top electrode may be separated from the corresponding variable resistance material due to, e.g., a subsequent thermal process.

In contrast, embodiments relate to variable resistance memory devices with improved reliability. Embodiments also relate to methods of forming a variable resistance memory device with improved reliability. For example, according to embodiments, an upper electrode may be in contact, e.g., direct contact, with a top surface and a sidewall of a variable resistance pattern. Thus, a contact area of the upper electrode and the variable resistance pattern may be increased. As a result, reliability of the variable resistance memory device may be improved.

For example, according to an exemplary embodiment, a variable resistance pattern may protrude from a mold layer, so that a contact area of the variable resistance pattern and an upper electrode may increase. To achieve this, e.g., the mold layer around the variable resistance pattern may be etched. Thus, the contact area may be increased and the interfacial separation risk may be decreased. In other words, it is possible to decrease an interfacial separation risk between the upper electrode and the variable resistance patterns that may be caused by the shrinkage of the variable resistance pattern in the subsequent thermal process. Thus, a parasitic resistance between the upper electrode and the variable resistance pattern may be reduced and a reset current may be reduced. As a result, reliability of the variable resistance memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims

What is claimed is:
1. A variable resistance memory device, comprising:
 a lower electrode on a substrate;
 a variable resistance pattern on the lower electrode;
 a mold layer in contact with a portion of a sidewall of the variable resistance pattern; and
 an upper electrode on the variable resistance pattern, the upper electrode being in contact with at least another portion of the sidewall of the variable resistance pattern.

2. The variable resistance memory device as claimed in claim 1, wherein a top surface of the variable resistance pattern is higher than a bottom surface of the upper electrode.

3. The variable resistance memory device as claimed in claim 1, wherein an upper portion of the variable resistance pattern protrudes above a top surface of the mold layer.

4. The variable resistance memory device as claimed in claim 3, wherein the upper electrode is in contact with an entirety of the upper portion of the variable resistance pattern.

5. The variable resistance memory device as claimed in claim 3, wherein:
the variable resistance pattern is one of a plurality of variable resistance patterns arranged in the mold layer, and
upper portions of the variable resistance patterns that protrude above the mold layer are connected to each other in a first direction.

6. The variable resistance memory device as claimed in claim 5, further comprising a first spacer between the mold layer and the lower electrode, the lower electrode being in the mold layer, being under the variable resistance pattern, and having an L-shaped cross section.

7. The variable resistance memory device as claimed in claim 6, further comprising:
a filling insulating layer between the variable resistance pattern and one of the plurality of variable resistance patterns adjacent to the variable resistance pattern; and
a second spacer between the filling insulating layer and the variable resistance pattern, and between the lower electrode and the filling insulating layer.

8. The variable resistance memory device as claimed in claim 7, wherein the filling insulating layer and the second spacer are formed of the same material as the mold layer.

9. The variable resistance memory device as claimed in claim 7, wherein top surfaces of the filling insulating layer, the second spacer, and the mold layer are substantially coplanar with each other.

10. The variable resistance memory device as claimed in claim 1, wherein the upper electrode extends to cover a top surface of the variable resistance pattern.

11. A variable resistance memory device, comprising:
an upper electrode extending in a first direction, the upper electrode including a plurality of indentations;
a plurality of variable resistance patterns arranged along the first direction, each of the plurality of variable resistance patterns including an upper portion within one of the plurality of indentations in the upper electrode; and
a plurality of insulating layers in contact with sidewalls of lower portions of the plurality of variable resistance patterns.

12. A variable resistance memory device, comprising:
an upper electrode extending in a first direction, the upper electrode including a plurality of indentations;
a plurality of variable resistance patterns arranged along the first direction, each of the plurality of variable resistance patterns including an upper portion within one of the plurality of indentations in the upper electrode;
a plurality of lower electrodes arranged along the first direction, each of the lower electrodes being in contact with one of the plurality of variable resistance patterns, and
a plurality of lower electrode pads arranged along the first direction,
wherein each of the plurality of lower electrodes are seated on a stepped portion of one of the plurality of lower electrode pads, and each of the plurality of variable resistance patterns overlap the stepped portion of one of the plurality of lower electrode pads.

13. The variable resistance memory device as claimed in claim 11, wherein:
the upper electrode is in contact with lateral sides of each of the plurality of variable resistance patterns, and
the plurality of variable resistance patterns are spaced apart from each other by a plurality of insulating layers, the lateral sides of the each of the plurality of variable resistance patterns protrude above uppermost surfaces of the insulating layers.

14. The variable resistance memory device as claimed in claim 11, wherein:
the plurality of indentations in the upper electrode have a same shape as the upper portion of each of the plurality of variable resistance patterns, and
an uppermost surface of each of the plurality of variable resistance patterns is substantially flat.

15. The variable resistance memory device as claimed in claim 11, wherein:
each of the plurality of variable resistance patterns include a lower portion that is surrounded by a plurality of insulating layers, the insulating layers defining recesses for housing the plurality of variable resistance patterns therein, and the upper portion of each of the plurality of variable resistance patterns being excluded from the recesses thereunder, and
the upper electrode is directly on at least one of the plurality of insulating layers, and the upper electrode is above each of the plurality of insulating layers.

* * * * *